(12) United States Patent
Iwaki et al.

(10) Patent No.: US 8,970,320 B2
(45) Date of Patent: Mar. 3, 2015

(54) FILTER CIRCUIT, DUPLEXER AND RF MODULE

(75) Inventors: Masafumi Iwaki, Tokyo (JP); Jun Tsutsumi, Tokyo (JP); Yuki Endo, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 628 days.

(21) Appl. No.: 13/280,530

(22) Filed: Oct. 25, 2011

(65) Prior Publication Data

US 2012/0119847 A1  May 17, 2012

(30) Foreign Application Priority Data

Nov. 17, 2010 (JP) .................................. 2010-257317

(51) Int. Cl.
| | |
|---|---|
| *H01P 5/12* | (2006.01) |
| *H03H 7/46* | (2006.01) |
| *H03H 9/72* | (2006.01) |
| *H03H 9/05* | (2006.01) |
| *H03H 9/54* | (2006.01) |
| *H03H 9/70* | (2006.01) |

(52) U.S. Cl.
CPC .............. *H03H 9/725* (2013.01); *H03H 9/0542* (2013.01); *H03H 9/0576* (2013.01); *H03H 9/542* (2013.01); *H03H 9/703* (2013.01)
USPC .............................. 333/132; 333/126; 333/129

(58) Field of Classification Search
USPC ................... 333/126–129, 132, 133
See application file for complete search history.

(56) References Cited

U.S. PATENT DOCUMENTS

| | | | | |
|---|---|---|---|---|
| 4,614,921 | A | * | 9/1986 | Yarman .......................... 333/139 |
| 5,023,866 | A | * | 6/1991 | De Muro ....................... 370/278 |
| RE37,639 | E | | 4/2002 | Ehara et al. |
| 7,362,384 | B2 | * | 4/2008 | Dauphinee et al. ........... 348/725 |
| 2007/0013458 | A1 | | 1/2007 | Itou et al. |
| 2009/0002095 | A1 | | 1/2009 | Terada et al. |
| 2010/0026419 | A1 | | 2/2010 | Hara et al. |
| 2010/0150075 | A1 | | 6/2010 | Inoue et al. |
| 2010/0244979 | A1 | | 9/2010 | Matsuda et al. |

FOREIGN PATENT DOCUMENTS

| | | |
|---|---|---|
| CN | 1190823 A | 8/1998 |
| JP | 55-026973 U | 2/1980 |
| JP | 57-048721 U | 3/1982 |

(Continued)

OTHER PUBLICATIONS

Chinese Office Action dated Jan. 30, 2014, in a counterpart Chinese patent application No. 201110363817.1.

(Continued)

*Primary Examiner* — Robert Pascal
*Assistant Examiner* — Kimberly Glennn
(74) *Attorney, Agent, or Firm* — Chen Yoshimura LLP

(57) ABSTRACT

A filter circuit includes a filter part connected between an input terminal and an output terminal and configured to have a passband, and a path connected in parallel with the filter part between the input terminal and the output terminal, the path having an impedance that enables a first signal passing through the path from the input terminal to the output terminal and a second signal passing through the filter part from the input terminal to the output terminal to have an opposite phase relationship in a frequency band outside of the passband and have almost equal amplitudes in the frequency band.

10 Claims, 23 Drawing Sheets

(56) References Cited

FOREIGN PATENT DOCUMENTS

| | | |
|---|---|---|
| JP | 60-082804 U | 6/1985 |
| JP | H06-260876 A | 9/1994 |
| JP | 09-167937 A | 6/1997 |
| JP | H10-256809 A | 9/1998 |
| JP | H10-303696 A | 11/1998 |
| JP | 2007-027949 A | 2/2007 |
| JP | 2009-33733 A | 2/2009 |
| JP | 2010-154437 A | 7/2010 |
| WO | 2009/025106 A1 | 2/2009 |

OTHER PUBLICATIONS

Japanese Office Action dated Apr. 8, 2014, in a counterpart Japanese patent application No. 2010-257317.

* cited by examiner

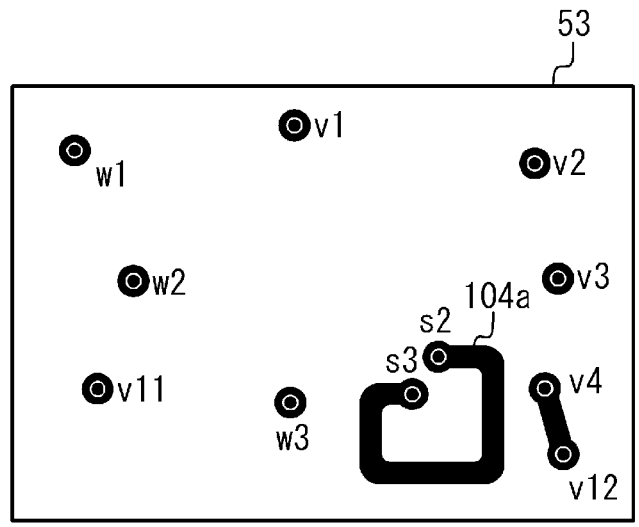
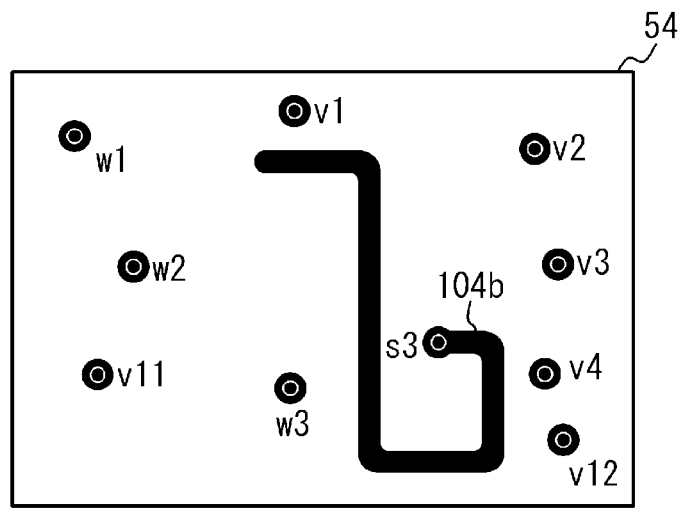
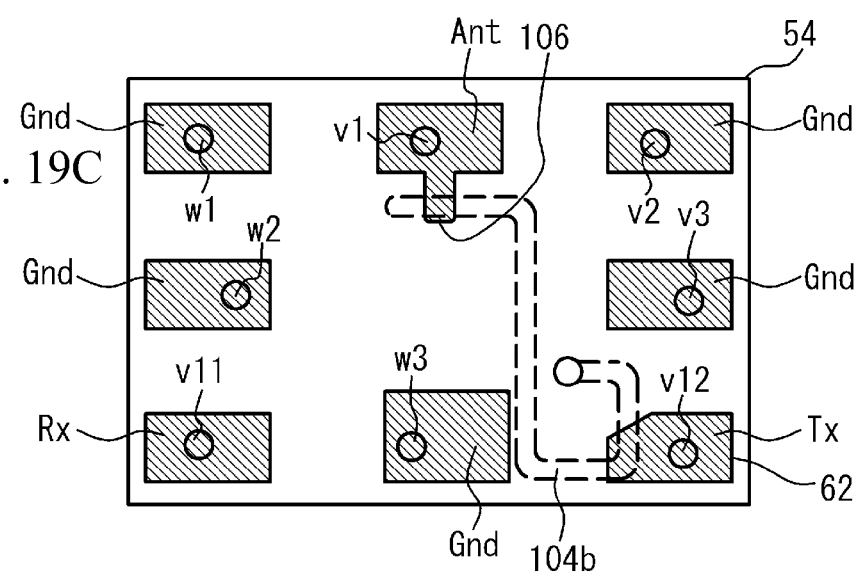

US 8,970,320 B2

FILTER CIRCUIT, DUPLEXER AND RF MODULE

CROSS-REFERENCE TO RELATED APPLICATION

This application is based upon and claims the benefit of priority of the prior Japanese Patent Application No. 2010-257317, filed on Nov. 17, 2010, the entire contents of which are incorporated herein by reference.

FIELD

An aspect of the invention discussed herein is related to a filter circuit, a duplexer and an RF (Radio Frequency) module. Another aspect of the invention is related to a filter circuit having a path connected in parallel with a filter part, a duplexer using such a filter circuit, and an RF module using such a duplexer.

BACKGROUND

A filter circuit is used as a RF circuit of mobile devices such as cellular phones. The filter circuit passes RF signals in a passband and attenuates signals out of the passband. The filter circuit may be configured to increase the attenuation in a particular frequency band outside of the pass band. Japanese Patent Application Publication No. 2009-33733 and PCT Pamphlet No 2009/025106 disclose methods of increasing the attenuation in the particular frequency band outside of the passband by connecting a phase shifter in series to the filter.

However, the use of the phase shifter connected in series to the filter increases the insertion loss.

SUMMARY OF THE INVENTION

According to an aspect of the present invention, there is provided a filter circuit including: a filter part connected between an input terminal and an output terminal and configured to have a passband; and a path connected in parallel with the filter part between the input terminal and the output terminal, the path having an impedance that enables a first signal passing through the path from the input terminal to the output terminal and a second signal passing through the filter part from the input terminal to the output terminal to have an opposite phase relationship in a frequency band outside of the passband and have almost equal amplitudes in the frequency band.

BRIEF DESCRIPTION OF THE DRAWINGS

FIGS. 19A through 19C are plan view of the upper or lower surface of each layer;

DETAILED DESCRIPTION

A description is now given of embodiments with reference to the accompanying drawings.

First Embodiment

Figure 1:
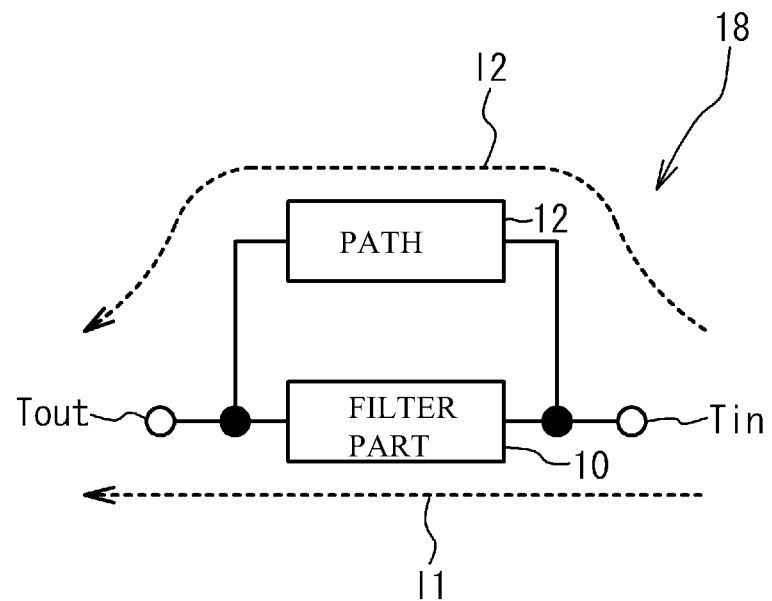
FIG. 1 is a circuit diagram of a filter circuit according to a first embodiment.

FIG. 1 is a circuit diagram of a filter circuit in accordance with a first embodiment.

Referring to FIG. 1, a filter circuit 18 is composed of a filter part 10 and a path 12. The filter part 10 is connected between an input terminal Tin and an output terminal Tout. The path 12 is connected in parallel with the filter part 10 between the input terminal Tin and the output terminal Tout. An input signal passing through the input terminal Tin is applied to the filter part 10 and the path 12. A signal I1 that passes through the filter part 10 and a signal I2 that passes through the path 12 are combined with each other and are then output via the output terminal Tout. The filter part 10 is a bandpass filter having a passband. The filter part 10 passes signals in the passband and attenuates signals outside of the passband.

The impedance of the path 12 is selected as follows. The first signal I1 and the second signal I2 have an opposite phase relationship at the output terminal Tout in a frequency band outside of the passband. Further, the first signal I1 and the second signal I2 have an equal amplitude in the frequency band.

According to the first embodiment, the first signal I1 and the second signal I2 have the opposite phase relationship. The first signal I1 and the second signal I2 have the equal amplitudes. Thus, the first signal I1 and the second signal I2 weaken each other. It is thus possible to attenuate the signal at the output terminal Tout. By adjusting the impedance of the path 12, it is possible to increase the attenuation in an arbitrary frequency band outside of the passband.

The opposite phase relationship between the first signal I1 and the second signal I2 attenuates the signals in the frequency band outside of the passband. Preferably, the opposite phase relationship has a phase difference of 180°±30° between the first signal I1 and the second signal I2, and more particularly, has a phase difference of 180°±10°. The identical amplitude of the first signal I1 and the second signal I2 attenuates the signals in the frequency band outside of the passband. Preferably, the identical amplitude of the first signal I1 and the second signal I2 has an amplitude ratio of I1 and I2 of 0.7~1.5, and more particularly, has an amplitude ratio of 0.9~1.2.

The filter part 10 may be a ladder type filter or a multimode type filter, for example.

Second Embodiment

Figure 2:
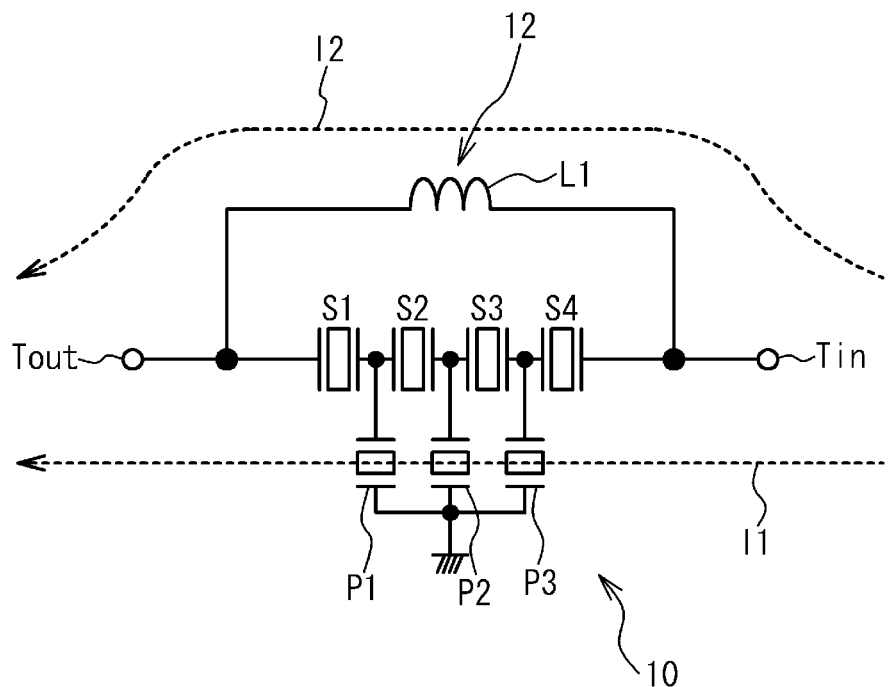
FIG. 2 is a circuit diagram of a filter circuit according to a second embodiment.

A second embodiment has an exemplary structure in which the path 12 includes an inductor. FIG. 2 is a circuit diagram of a filter circuit according to the second embodiment. The filter part 10 has a ladder type filter. The path 12 includes an inductor L1 having two ends. One of the two ends is connected to the input terminal Tin and the other end is connected to the output terminal Tout. The filter part 10 includes one or multiple series resonators S1~S4 and one or multiple parallel resonators P1~P3. The series resonators S1~S4 are connected in series between the input terminal Tin and the output terminal Tout. The parallel resonators P1~P3 are connected in parallel between the input terminal Tin and the output terminal Tout.

A simulation was conducted in which the inductance of the inductor L1 was set to 150 nH and the filter part 10 was a ladder type filter. The ladder type filter had a six-stage configuration and had surface acoustic wave resonators using a piezoelectric substrate of lithium tantalate (LiTaO$_3$). The passband of the filter part 10 was 1920 MHz to 1980 MHz. Another filter having a changed filter part 10 without the path 12 was prepared as a comparative example.

Figure 3A:
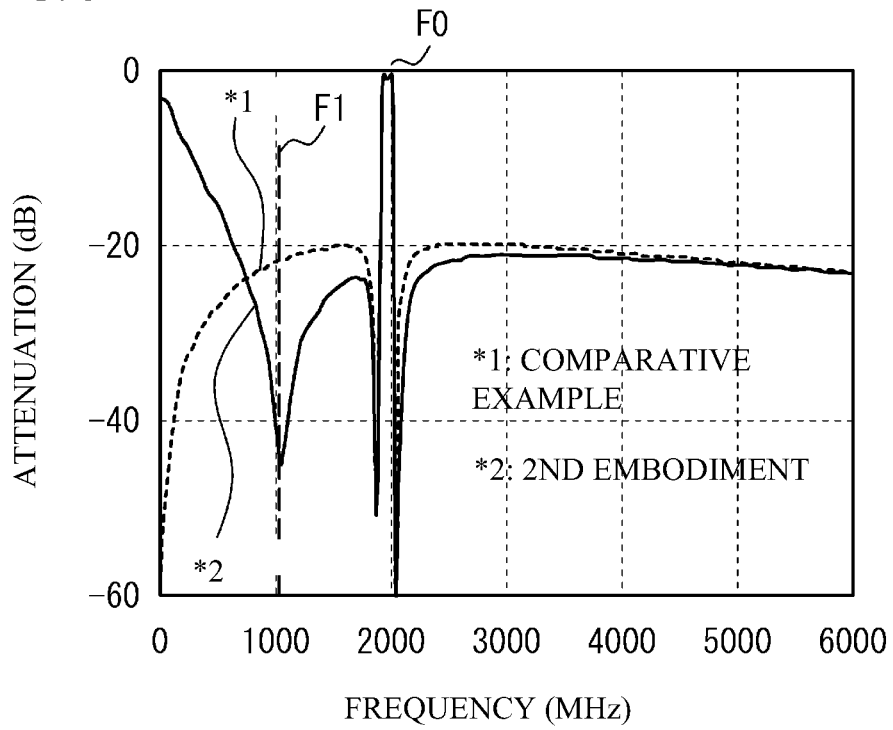
FIG. 3A illustrates a passband characteristic of the filter circuit of the second embodiment.
Figure 3B:
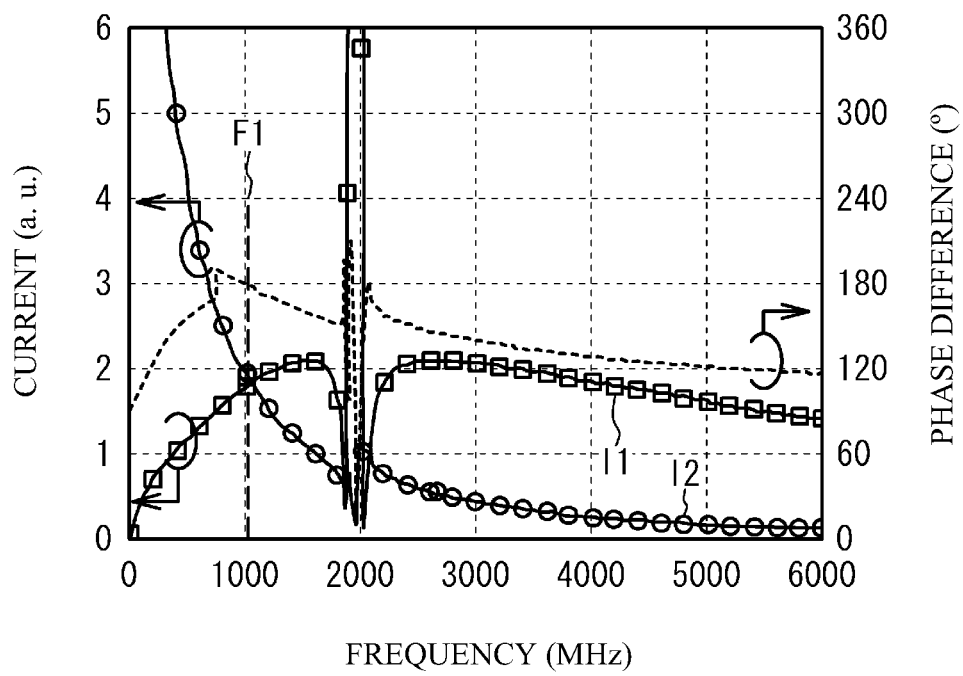
FIG. 3B illustrates currents of signals and phase differences between the signals associated with the frequency in the filter circuit of the second embodiment.

FIG. 3A illustrates a passband characteristic of the filter circuit of the second embodiment, and FIG. 3B illustrates currents of signals and phase differences between the signals associated with the frequency in the filter circuit of the second embodiment. In FIG. 3A, a solid line indicates the second embodiment, and a broken line indicates the comparative example. In FIG. 3B, a symbol □ indicates an amplitude of the current component of the first signal I1 in arbitrary units, and a symbol ○ indicates an amplitude of the current component of the second signal I2 in arbitrary units. A broken line indicates the phase difference between the first signal I1 and the second signal I2. As illustrated in FIG. 3A, in both the comparative example and the first embodiment, a passband F0 is located close to 2 GHz. As illustrated in FIG. 3B, the first signal I1 and the second signal I2 have almost the same amplitudes in a frequency band F1 close to 1 GHz. Further, in the frequency band F1, the first signal I1 and the second signal I2 have a phase difference approximately equal to 180°. Thus, as illustrated in FIG. 3A, in the filter circuit of the second embodiment, the attenuation increases in the frequency band F1.

The resonators used in the filter part 10 do not exhibit any resonance performance at frequencies outside of the passband and is considered to be capacitors. For example, the SAW resonator is considered to be a capacitor defined by the dielectric constant of the piezoelectric substrate and the electrode-finger pitch. For example, a piezoelectric thin-film resonator is considered to be a capacitor defined by the dielectric constant of a piezoelectric film and the areas of upper and lower electrodes facing each other across the piezoelectric film. Thus, the second embodiment uses the path 12 having an inductive impedance as in the case of the first embodiment. It is thus possible to make the phases of the first signal I1 and the second signal I2 opposite to each other. It is thus possible to attenuate the signal resulting from the combination of the first signal I1 and the second signal I2 at the output terminal Tout.

The inductor L1 may be a lumped-constant inductor. The inductor L1 may be a chip inductor, a spiral inductor in a stacked multilayer substrate, or a bonding wire. In the comparative example, the frequency band F1 is close to 1 GHz. However, the frequency band F1 may be set arbitrarily by setting the impedance of the path 12 appropriately.

Third Embodiment

Figure 4:
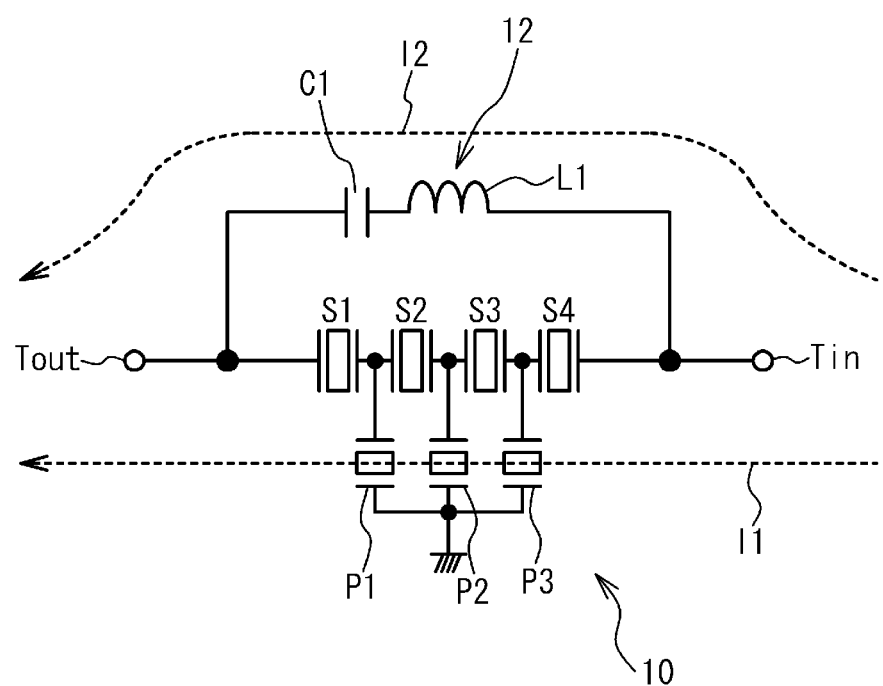
FIG. 4 is a circuit diagram of a filter circuit according to a third embodiment.

A third embodiment has an exemplary configuration in which the path 12 is composed of an inductor and a capacitor. FIG. 4 is a circuit diagram of a filter circuit according to the third embodiment. As compared with FIG. 2 of the second embodiment, the path 12 includes a capacitor C1 connected in series to the inductor L1, and the LC circuit thus configured is connected between the input terminal Tin and the output terminal Tout. The other structures of the third embodiment are the same as those of the second embodiment illustrated in FIG. 2, and a description thereof is omitted here. A simulation was conducted in which the inductance of the inductor L1 was set to 250 nH and the capacitance of the capacitor C1 was set to 0.2 pF. The other conditions are the same as those of the simulation of the second embodiment.

Figure 5A:
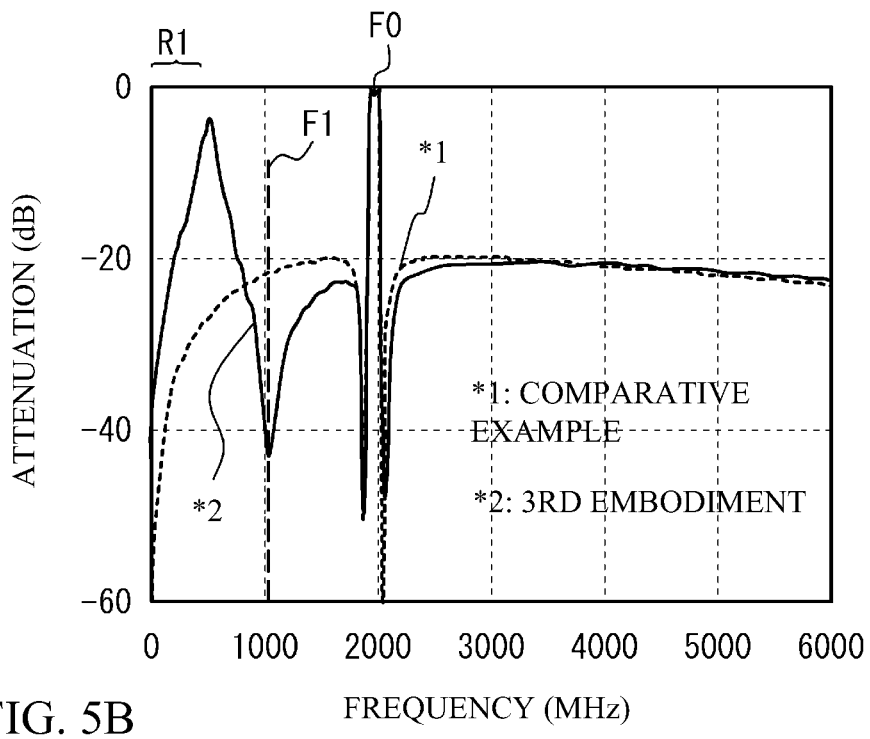
FIG. 5A illustrates a passband characteristic of the filter circuit of the third embodiment.
Figure 5B:
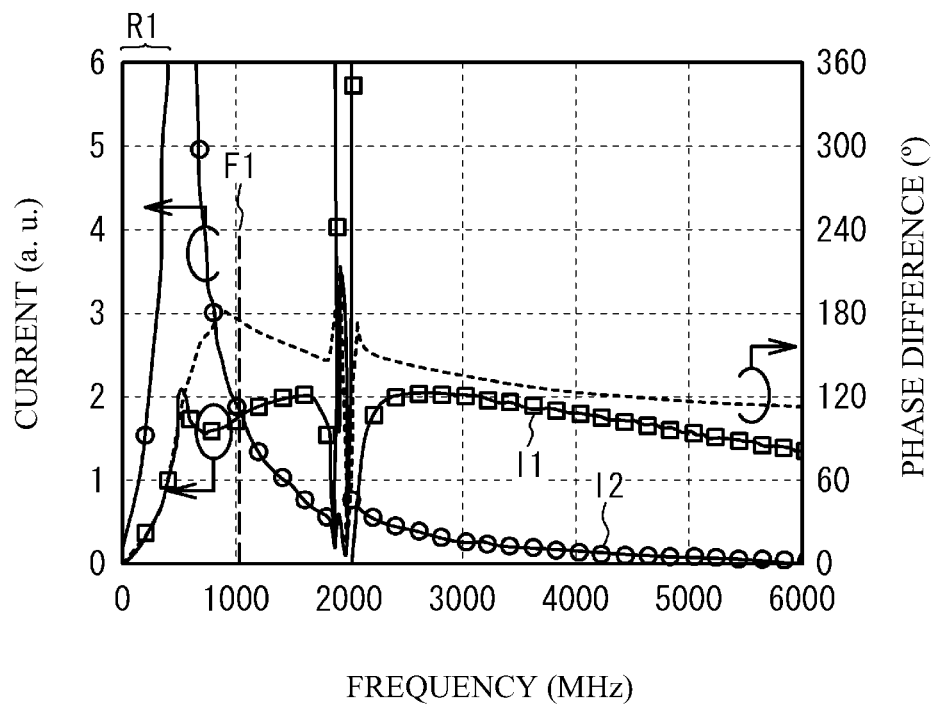
FIG. 5B illustrates current of signals and phase differences between signals associated with the frequency in the filter circuit of the third embodiment.

FIG. 5A illustrates a passband characteristic of the filter circuit of the third embodiment, and FIG. 5B illustrates currents of signals and phase differences between the signals associated with the frequency in the filter circuit of the third embodiment.

In the second embodiment, as illustrated in FIG. 3A, the amount of attenuation is small at low frequencies, which are close to DC. This is because the path 12 is the inductor L1 and the second signal I2 has a large amplitude at low frequencies, as illustrated in FIG. 3B.

In the third embodiment, as illustrated in FIG. 5B, the signal I2 is reduced in a low-frequency range R1 due to the capacitor C1. It is thus possible to increase the amount of attenuation in the low-frequency range R1, as illustrated in FIG. 5A. As described above, the path 12 is configured to have an impedance that changes from a capacitive impedance due to the dominant capacitor component to an inductive impedance due to the dominant inductive component at the low-frequency side of the low-frequency range R1 (at frequencies lower than the low-frequency range R1) and that is an inductive impedance at the high-frequency side of the low-frequency range R1 (at frequencies higher than the range R1). It is thus possible to improve the attenuation characteristic in the low-frequency range.

The capacitor C1 used in the third embodiment may be a lumped-constant capacitor, which may be, for example, a chip capacitor, or an MIM (Metal Insulator Metal) capacitor in a stacked multilayer substrate.

The configuration illustrated in FIG. 4 may be varied to interchange the positions of the capacitor C1 and the inductor L1 with each other so that the capacitor C1 is closer to the input terminal Tin and the inductor is closer to the output terminal Tout.

Fourth Embodiment

Figure 6:
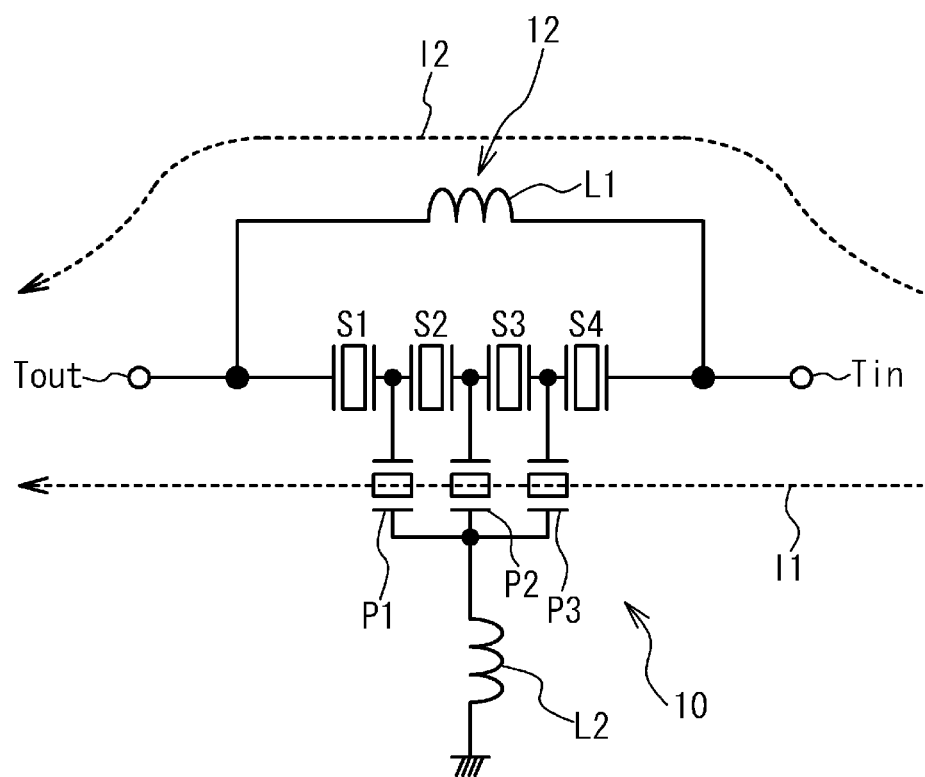
FIG. 6 is a circuit diagram of a filter circuit according to a fourth embodiment.

A fourth embodiment has an exemplary configuration in which an inductor is connected between parallel resonators and ground. FIG. 6 is a circuit diagram of a filter circuit according to the fourth embodiment. As compared with the second embodiment illustrated in FIG. 2, an inductor L2 is connected between the parallel resonators P1~P3 and ground. The other structures of the fourth embodiment are the same as those of the second embodiment, and a description thereof is omitted here. A simulation was conducted in which the inductance of the inductor L1 was set to 150 nH and the inductance of the inductor L2 was set to 0.2 nH. The other conditions were the same as those of the simulation of the second embodiment.

Figure 7A:
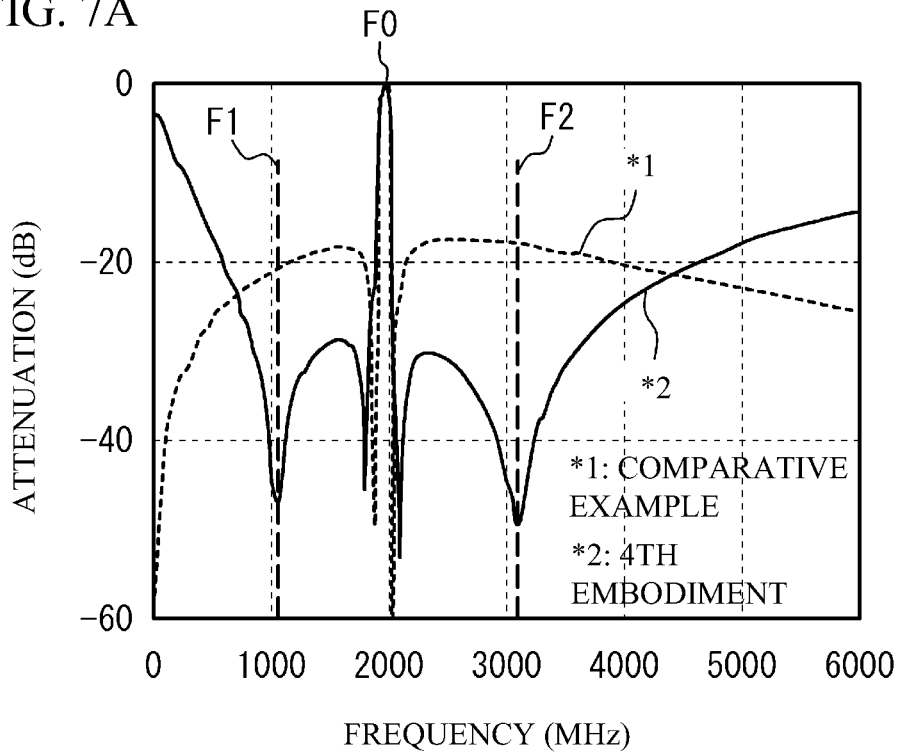
FIG. 7A illustrates a passband characteristic of the filter circuit of the fourth embodiment.
Figure 7B:
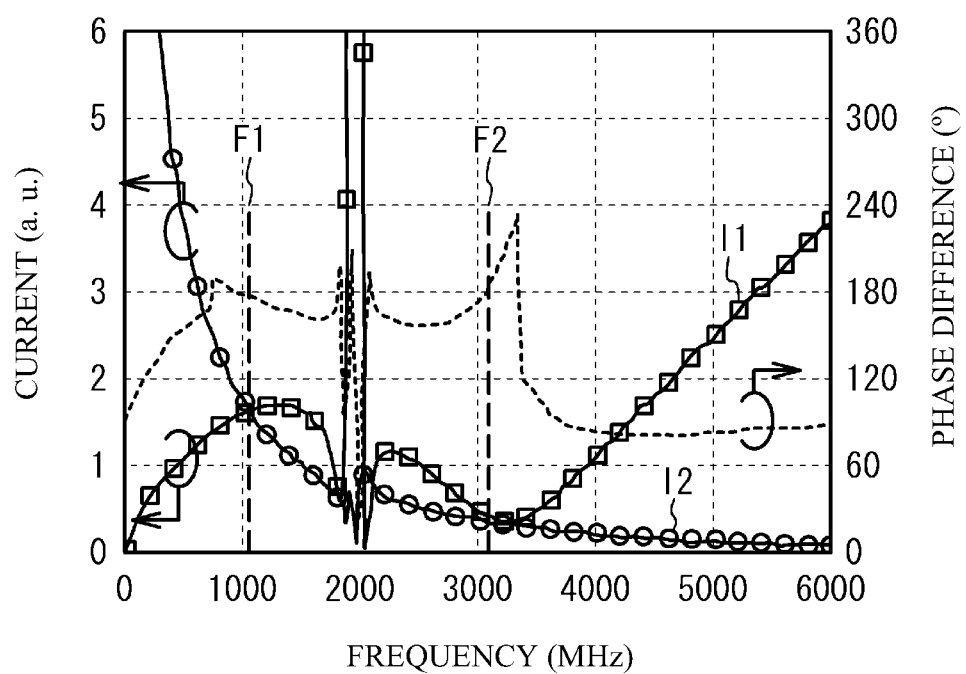
FIG. 7B illustrates currents of signals and phase differences between signals associated with the frequency in the filter circuit of the fourth embodiment.

FIG. 7A illustrates a passband characteristic of the filter circuit of the fourth embodiment, and FIG. 7B illustrates currents of signals and phase differences between the signals associated with the frequency in the filter circuit of the fourth embodiment.

As illustrated in FIG. 7B, the first signal I1 and the second signal I2 have almost equal amplitudes even in a frequency band F2 close to 3 GHz in addition to the frequency band F1. Further, the first signal I1 and the second signal I2 are approximately 180° out of phase. In other words, the first signal I1 and the second signal I2 have an opposite phase relationship. Thus, as illustrated in FIG. 7A, the amount of attenuation increases in the frequency band F2 as well as the frequency band F1.

The fourth embodiment adjusts the impedance of the path 12 and the inductance of the inductor L2 so that the frequency bands F1 and F2 having an increased amount of attenuation can be positioned at the low-frequency side of the passband F0 (at frequencies lower than the passband F0) and at the high-frequency side thereof (at frequencies higher than the passband F0). The frequency bands F1 and F2 may be set arbitrarily by appropriately setting the impedance of the path 12 and the inductance of the inductor L2.

According to the fourth embodiment, the inductor L2 connected between the parallel resonators P1~P3 and ground forms two attenuation poles. The attenuation pole in the frequency band F2 is formed under the condition that the first signal I1 and the second signal I2 have almost equal amplitudes and the first signal I1 and the second signal I2 are approximately 180° out of phase. The resonance of the parallel resonators and the inductor is not involved in forming the attenuation pole in the frequency band F2.

Fifth Embodiment

Figure 8A:
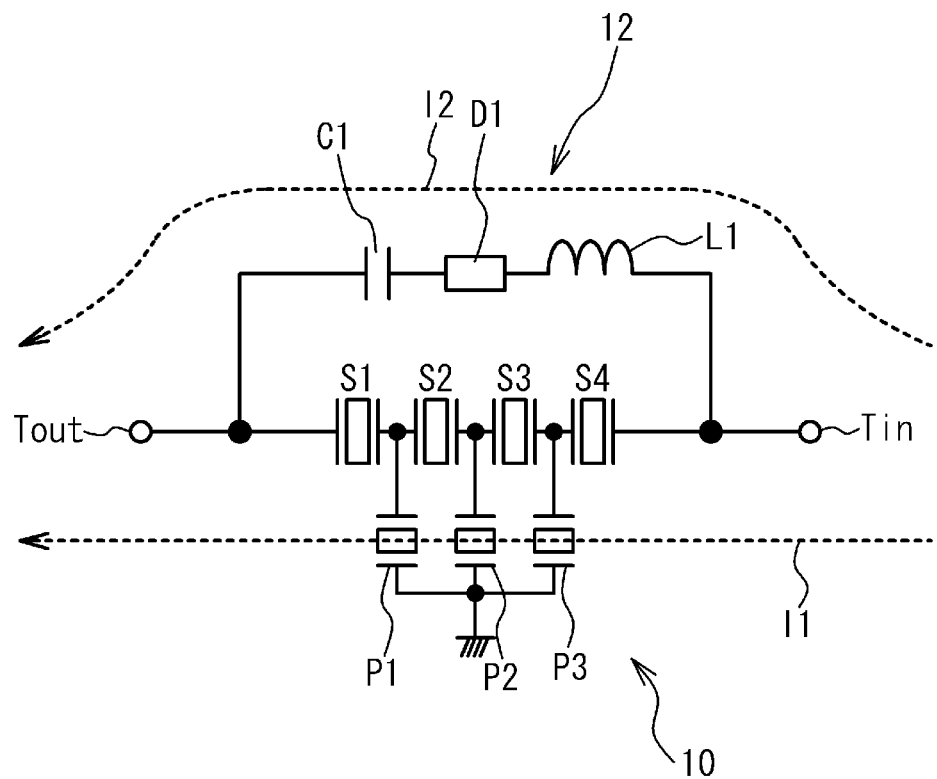
FIG. 8A is a circuit diagram of a filter circuit according to a fifth embodiment.
Figure 8B:
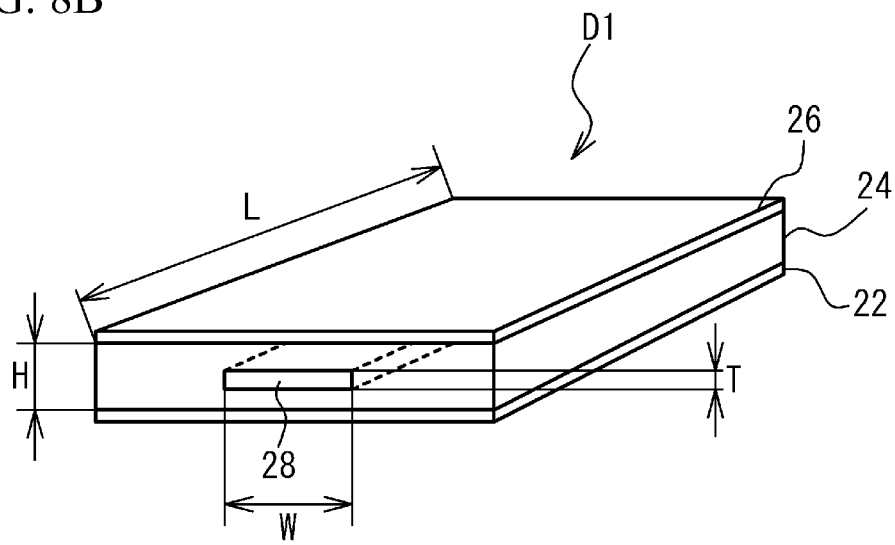
FIG. 8B is a sectional perspective view of a distributed-constant line Dl.

A fifth embodiment has an exemplary configuration in which the path 12 includes an inductor and a distributed-constant line. FIG. 8A is a circuit diagram of a filter circuit according to the fifth embodiment. As compared with the third embodiment illustrated in FIG. 4, the path 12 has a distributed-constant line D1 between the inductor L1 and the capacitor C1. One end of the distributed-constant line is connected to the inductor L1, and the other end thereof is connected to the capacitor C1. FIG. 8B is a sectional perspective view of the distributed-constant line D1. As illustrated in FIG. 8B, the distributed-constant line D1 is formed by a strip line, which has a dielectric layer 24 sandwiched between ground electrodes 22 and 26. A conductive layer 28 extends in the dielectric layer 24. The impedance of the distributed-constant line D1 may be set by using the permittivity of the dielectric layer 24, the thickness H of the dielectric layer 24, the thickness T of the conductive layer 28, the width W of the conductive layer 28 and the length L of the conductive layer 28. The distributed-constant line D1 may be a microstrip line. The other structures of the fifth embodiment are the same as those of the third embodiment illustrated in FIG. 4, and a description thereof is omitted here. A simulation was conducted in which the inductance of the inductor L1 was set to 30 nH and the capacitance of the capacitor C1 was set to 0.1 pF. The dielectric constant of the dielectric layer 24 was set to 4.8, and H, T, W and L were set to 85 µm, 25 µm, 100 µm, and 1 mm, respectively. The other conditions were the same as those of the simulation of the second embodiment.

Figure 9A:
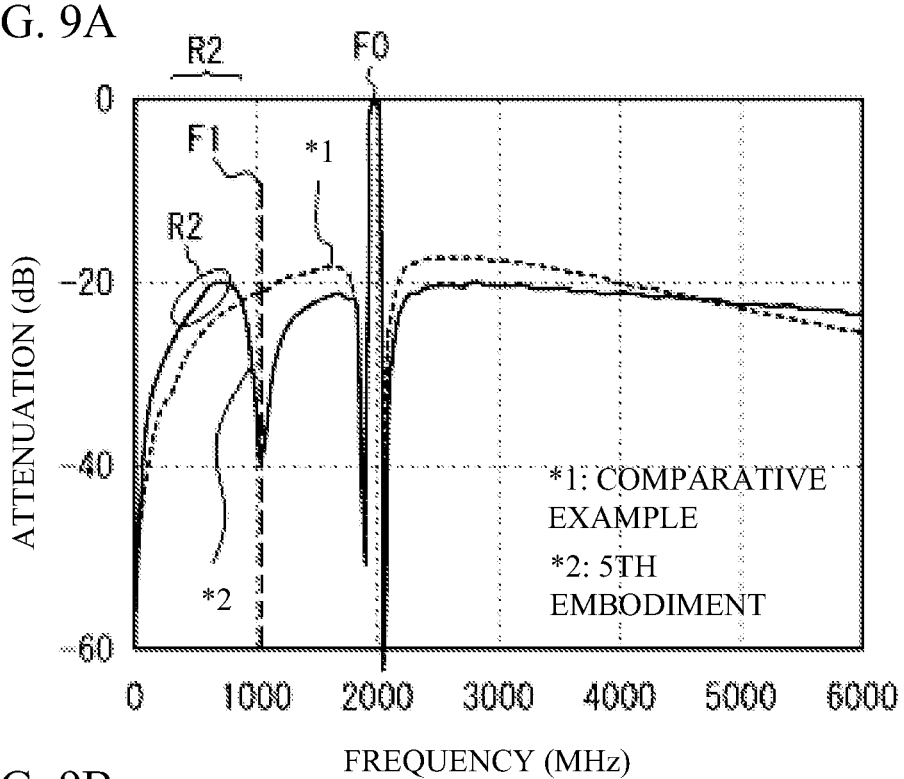
FIG. 9A illustrates a passband characteristic of the filter circuit according to the fifth embodiment.
Figure 9B:
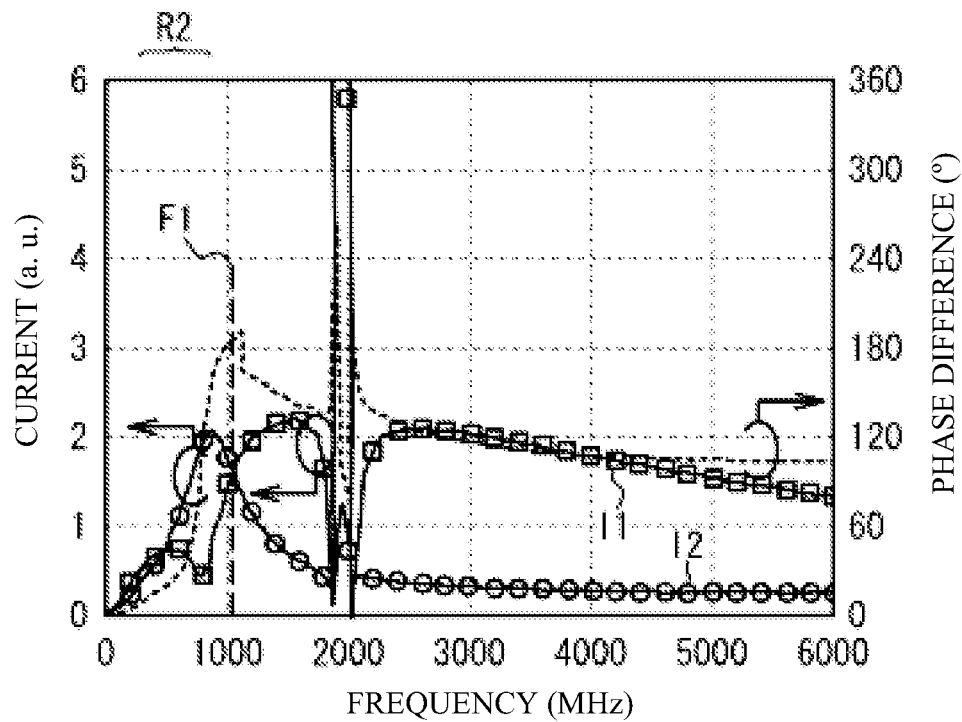
FIG. 9B illustrates currents of signals and phase differences between signals associated with the frequency in the filter circuit of the fifth embodiment.

FIG. 9A illustrates a passband characteristic of the filter circuit of the fifth embodiment, and FIG. 9B illustrates currents of signals and phase differences between the signals associated with the frequency in the filter circuit of the fifth embodiment.

As illustrated in FIG. 9B, the first signal I1 and the second signal I2 have almost equal amplitudes even in the frequency band F1. Further, the first signal I1 and the second signal I2 are approximately 180° out of phase. Thus, as illustrated in FIG. 9A, the amount of attenuation increases in the frequency band F1. Further, the use of the distributed-constant line D1 decreases the Q value of the whole path 12, and suppresses variations of the filter characteristics. For example, it is possible to make the peal of the attenuation in a range R2 in FIG. 9A smaller than that in the third embodiment illustrated in FIG. 5A.

According to the fifth embodiment, the path 12 includes the distributed-constant line D1 connected in series to the inductor L1 between the input terminal Tin and the output terminal Tout. Thus, the distributed-constant line D1 has the phase converting function of the inductor L1 and part of the function of attenuating the signal amplitude. Thus, the circuit may be designed more flexibly because the lumped-constant inductor L1 and the distributed-constant line D1 have a complementary relationship. For example, it is possible to flexibly design the frequency band in which the amount of attenuation is increased.

Preferably, elements close to the input terminal Tin or the output terminal Tout are lumped-constant elements in order to realize the opposite phase relationship between the first signal I1 and the second signal I2. This has been confirmed by an experiment conducted by the inventors. Thus, the distributed-constant line D1 is connected directly between the inductor L1 and the capacitor C1.

The first through fifth embodiments may be varied so that the path 12 may be provided between the input terminal Tin and a halfway point of the filter part 10 or between a halfway point of the filter part 10 and the output terminal Tout. For example, in a case where the filter part 10 is of ladder type in the second through fifth embodiments, the path 12 may be connected between a node between adjacent series resonator in the halfway of the filter part 10 (for example, the connecting node between the series resonators S2 and S3) and the input terminal Tin. For example, the path 12 may be connected between the node connecting adjacent series resonators together in the halfway of the filter part 10 and the output terminal Tout. The path 12 may be connected between the node connecting adjacent series resonators together and the node connecting adjacent other series resonators (for example, between the node connecting S1 and S2 together and the node connecting S2 and S3). These variations are configured so that the first signal I1 that passes through the filter part 10 and the second signal that passes through part of the filter part 10 have the opposite phase relationship, and that the first signal I1 and the second signal I2 have almost equal amplitudes.

Figure 10:
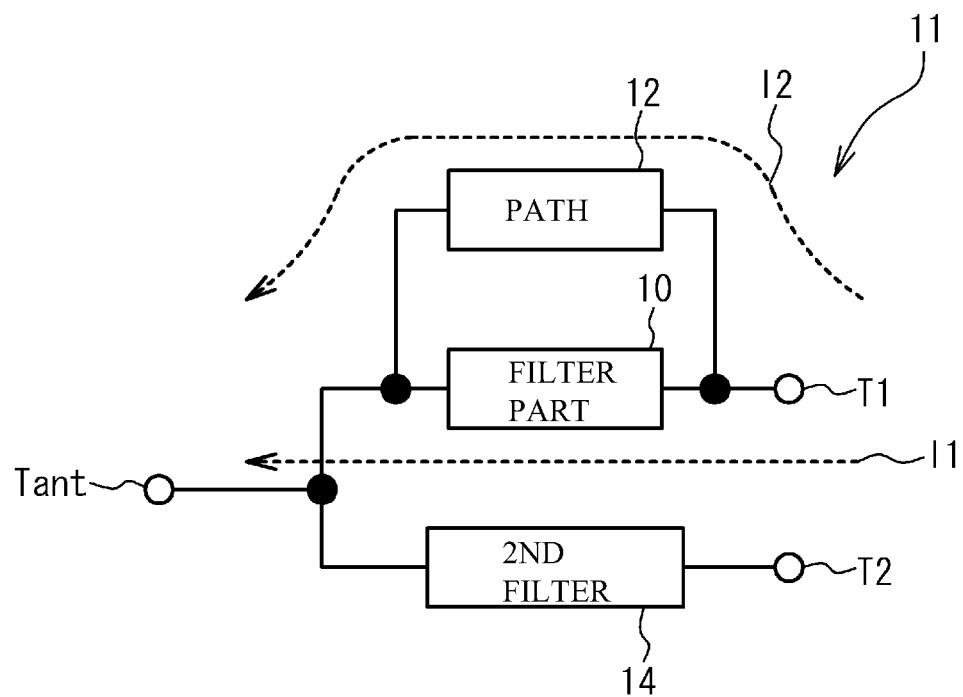
FIG. 10 is a circuit diagram of a duplexer according to a sixth embodiment.

A sixth embodiment has an exemplary duplexer. FIG. 10 is a circuit diagram of a duplexer according to the sixth embodiment. Referring to FIG. 10, a first filter 11 is connected between a common terminal Tant and a first terminal T1. A second filter 14 is connected between the common terminal Tant and a second terminal T2. The first filter 11 may be any of the filter circuits according to the first through fifth embodiments.

At least one of the first filter 11 and the second filter 14 of the duplexer may be any of the filter circuits according to the first through fifth embodiments. The duplexer with a transmission filter and a reception filter is required to have suppressed insertion loss, particularly, in the transmission filter. It is therefore preferable that the transmission filter is formed by the filter circuit according to any of the first through fifth embodiments.

Seventh Embodiment

Figure 11:
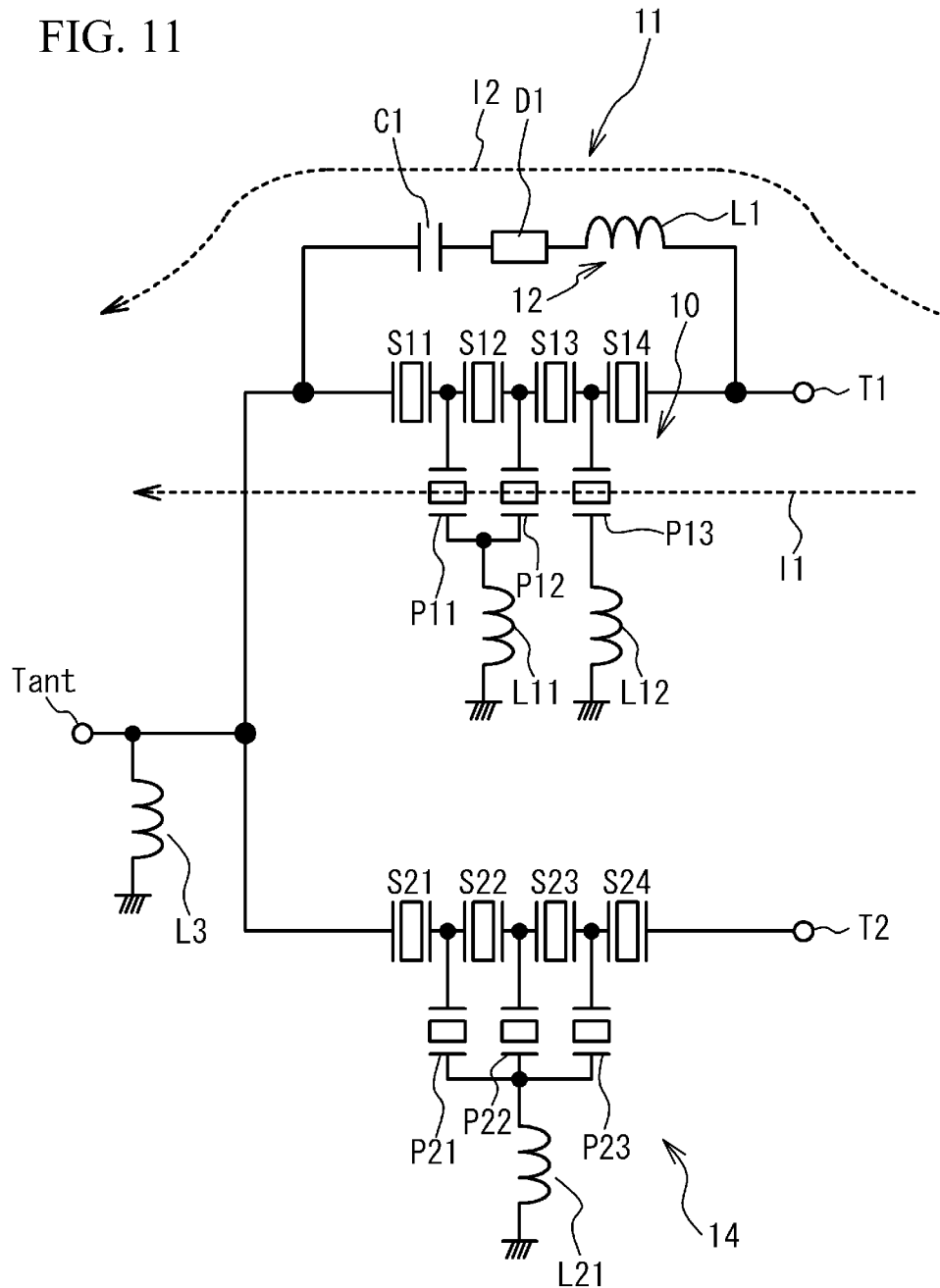
FIG. 11 is a circuit diagram of a duplexer according to a seventh embodiment.

A seventh embodiment has an exemplary detailed configuration of the duplexer. FIG. 11 is a circuit diagram of the duplexer according to the seventh embodiment. The first filter 11 of the seventh embodiment is formed by the filter circuit of the fourth embodiment. The filter part 10 of the first filter 11 is equipped with the series resonators S11~S14 and the parallel resonators P11~P13. The parallel resonators P11 and P12 are grounded via an inductor L11. The parallel resonator P13 is grounded via an inductor L12. The second filter 14 is a ladder type filter and is equipped with series resonators S21~S24 and parallel resonators P21~P23. The parallel resonators P21~P23 are grounded via an inductor L21. The common terminal Tant is grounded via an inductor L3, which functions as a matching circuit. The other structures of the seventh embodiment are the same as those of the fifth embodiment, and a description thereof is omitted. In the following, it is assumed that the first filter 11 is a transmission filter and the second filter 14 is a reception filter.

Figure 12A:
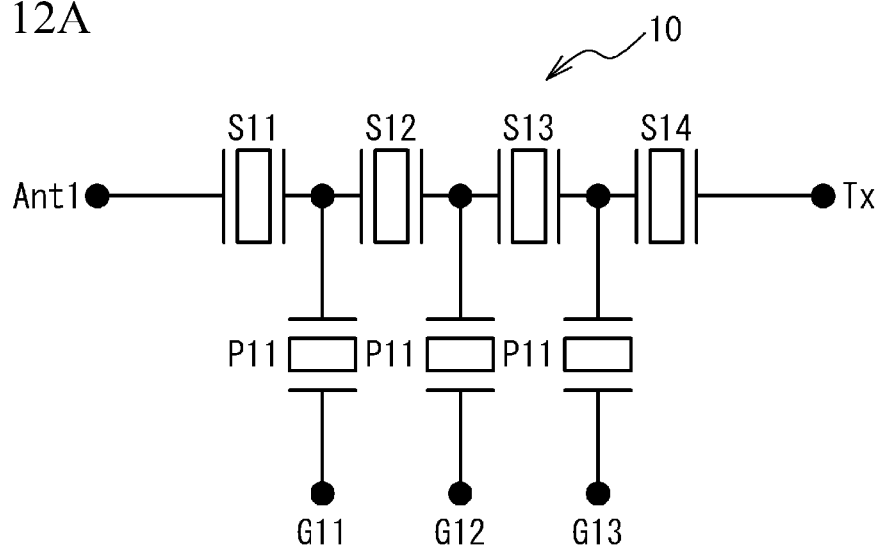
FIG. 12A is a circuit diagram of a transmission filter.
Figure 12B:
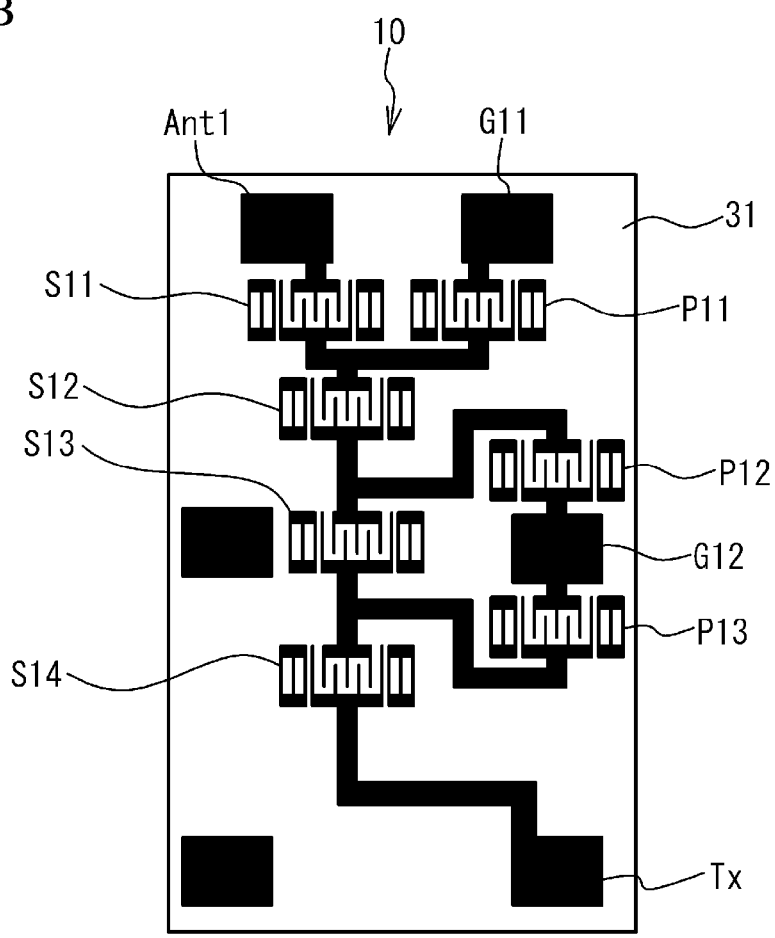
FIG. 12B is a plan view of a chip on which a filter part of the transmission filter is formed.

FIG. 12A is a circuit diagram of the filter part 10 of the transmission filter, and FIG. 12B is a plan view of a chip on which the filter part 10 of the transmission filter is formed. FIG. 12B is a view seen through the chip from the back surface to the front surface. Referring to FIG. 12A, the filter part 10 has the series resonators S11~S14 between an antenna terminal Ant1 and a transmission terminal Tx. The parallel resonators P11~P13 are connected in parallel between the antenna terminal Ant1 and the transmission terminal Tx. As illustrated in FIG. 12B, the series resonators S11~S14 and the parallel resonators P11~P13 are formed on a piezoelectric substrate 31 made of lithium tantalate or lithium niobate as SAW resonators. Pads Ant1, G11, G12, G12 and Tx illustrated in FIG. 12B correspond to the terminals Ant1, G11, G12, G13 and Tx illustrated in FIG. 12A, respectively. The pad G12 in FIG. 12B is a pad formed by unifying the terminals G12 and G13 in FIG. 12A.

Figure 13A:
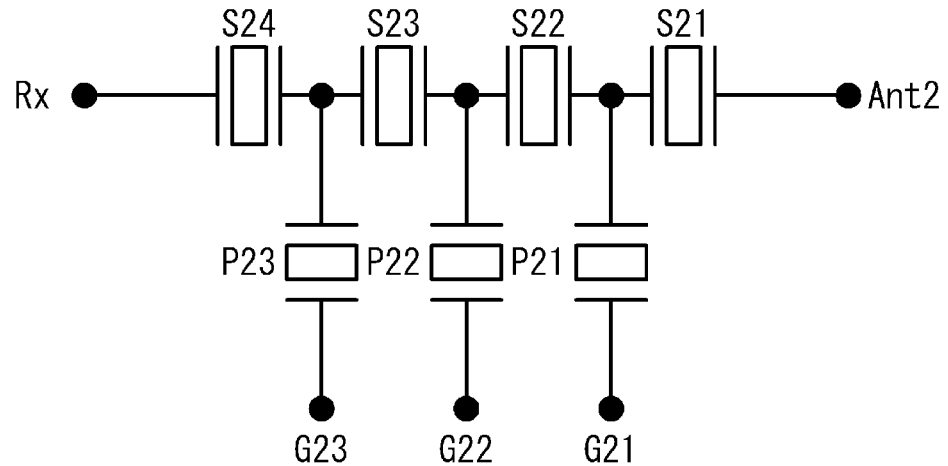
FIG. 13A is a circuit diagram of a reception filter.
Figure 13B:
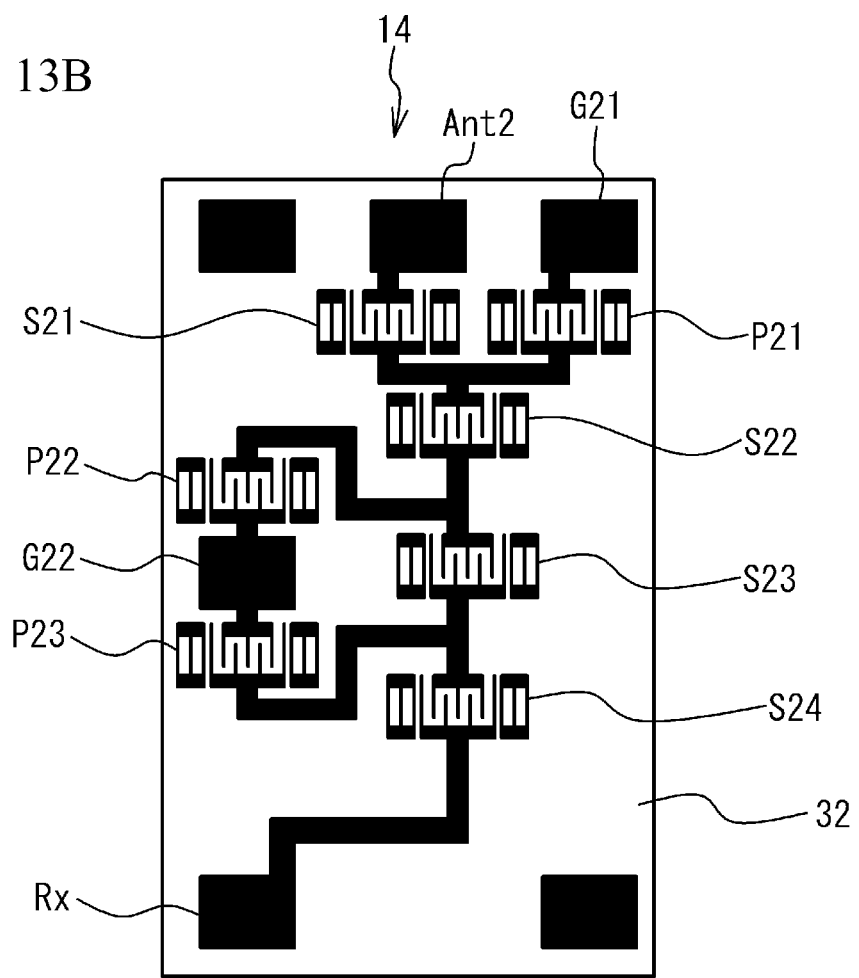
FIG. 13B is a plan view of a chip on which a filter part of the reception filter is formed.

FIG. 13A is a circuit diagram of the reception filter 14, and FIG. 13B is a plan view of a chip on which the reception filter 14 is formed. FIG. 13B is a view seen through the chip from the back surface to the front surface. As illustrated in FIG. 13A, the reception filter 14 has the series resonators S21~S24 connected in series between an antenna terminal Ant2 and a reception terminal Rx. The parallel resonators P21~P23 are connected in parallel between the antenna terminal Ant2 and the reception terminal Rx. The parallel resonators P21~P23 have ends connected to terminals G21~G23, respectively. As depicted in FIG. 13B, the series resonators S21~S24 and the parallel resonators P21~P23 are formed on the piezoelectric substrate 32. Pads Ant2, G21 and Rx in FIG. 13B correspond to the terminals Ant2, G21 and Rx, respectively. The pad G22 in FIG. 13B is a pad formed by unifying to the terminals G22 and G23.

Figure 14A:
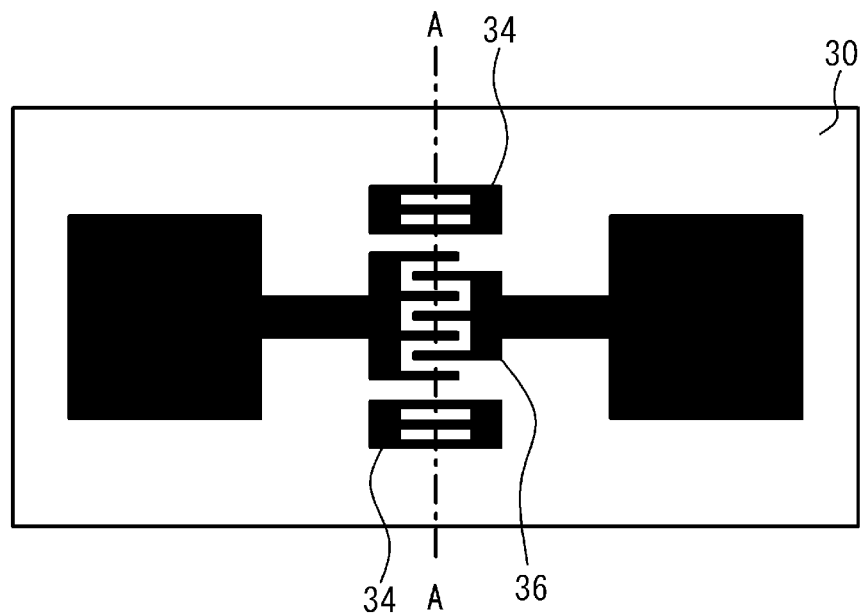
FIG. 14A is a plan view of a SAW resonator.
Figure 14B:
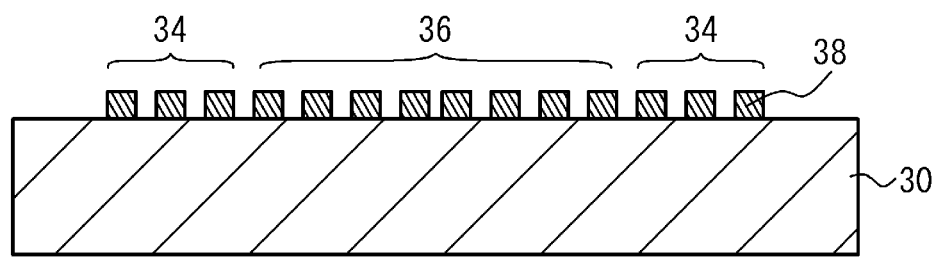
FIG. 14B is a sectional view taken along a line A-A in FIG. 14A.

FIG. 14A is a plan view of a SAW resonator, and FIG. 14B is a sectional view taken along a line A-A in FIG. 14A. Referring to FIGS. 14A and 14B, electrodes 38 having Al as the main component are formed on a piezoelectric substrate 30. The electrodes 38 form reflectors 34 and comb electrodes 36. Surface acoustic waves excited by the comb electrodes 36 are reflected by the reflectors 34 and resonate with each other.

Figure 15A:
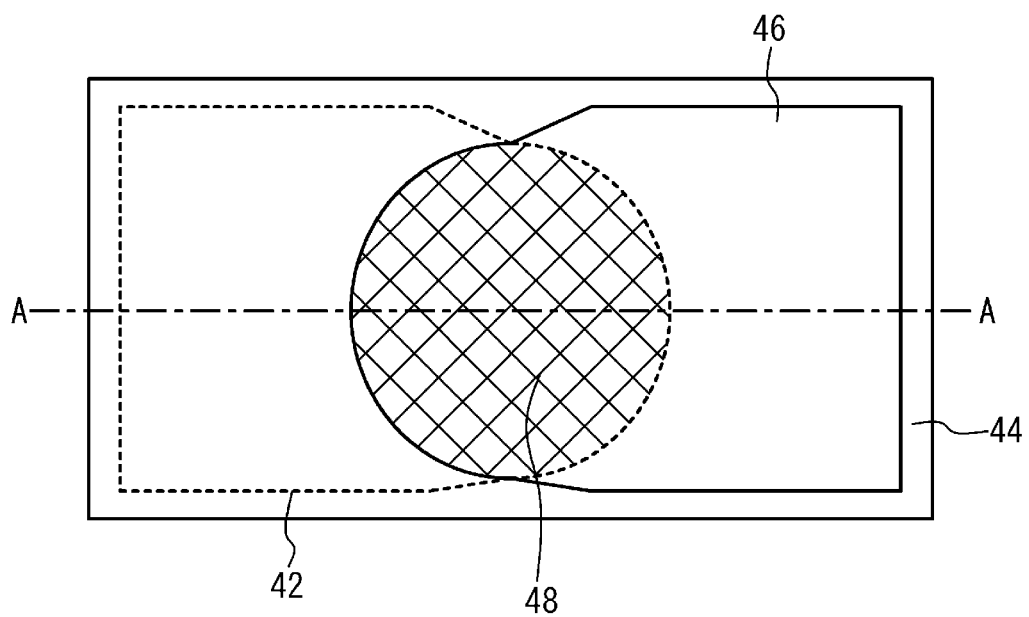
FIG. 15A is a plan view of a piezoelectric thin film resonator.
Figure 15B:
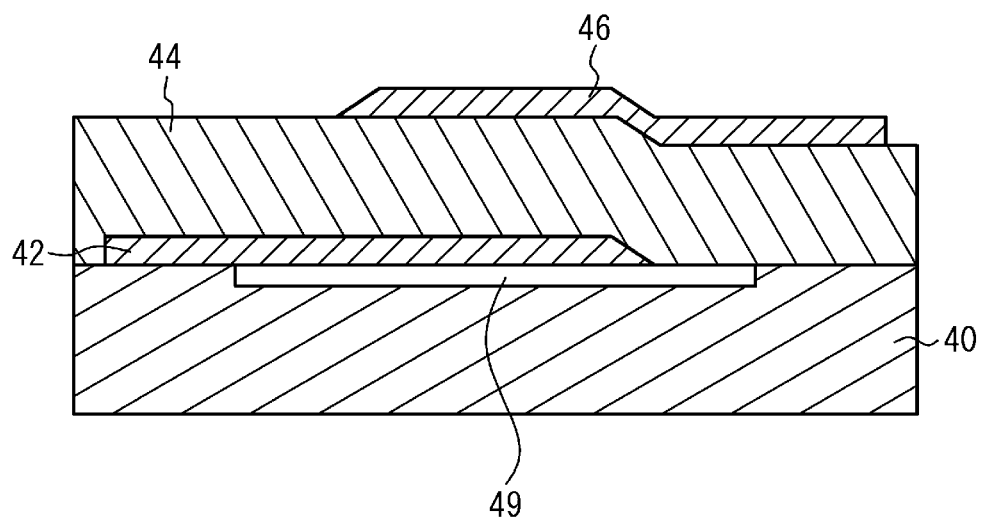
FIG. 15B is a sectional view taken along a line A-A in FIG. 15A.

The SAW resonator may be replaced with a piezoelectric thin-film resonator, or a film bulk acoustic resonator (FBAR). FIG. 15A is a plan view of an exemplary FBAR, and FIG. 15B is a sectional view taken along a line A-A in FIG. 15A. Referring to FIGS. 15A and 15B, a lower electrode 42, a piezoelectric film 44 made of AlN, and an upper electrode 46 are serially stacked on a silicon substrate 40. A resonant zone 48 is formed by overlapping the upper electrode 46 and the lower electrode 42 between which the piezoelectric film 44 is sandwiched. In the resonant zone 48, acoustic waves are propagated vertically and resonate with each other. A cavity 49 is formed below the resonant zone 48. In FIG. 15B, the cavity 49 is a recess formed in the silicon substrate 40. The cavity 49 may be replaced with an acoustic multilayered film.

Figure 16A:
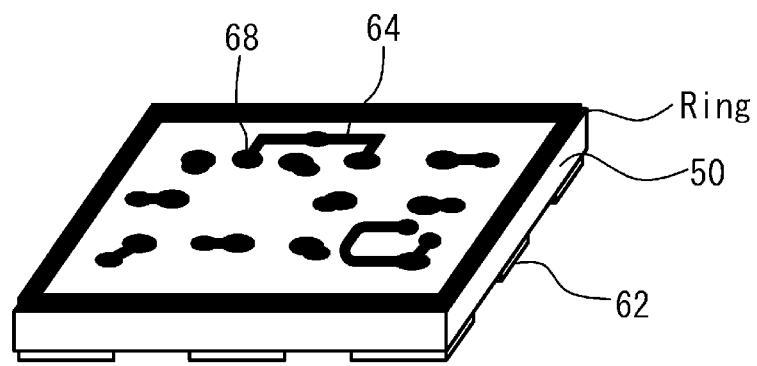
FIGS. 16A through 16C illustrate a duplexer mounted on a substrate according to a seventh embodiment.
Figure 16B:
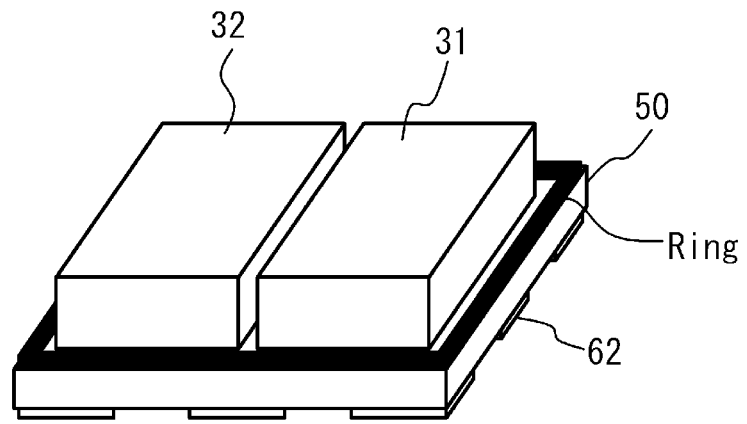
Figure 16C:
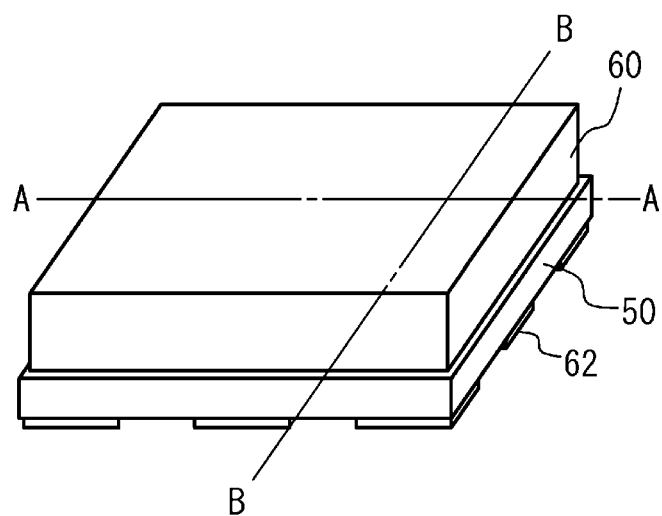
Figure 17A:
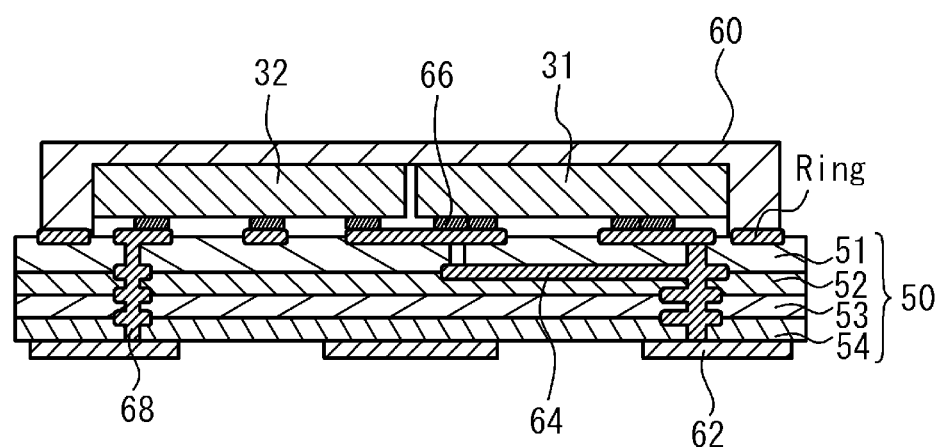
FIGS. 17A and 17B are sectional views taken along a line A-A and a line B-B in FIG. 16C, respectively.
Figure 17B:
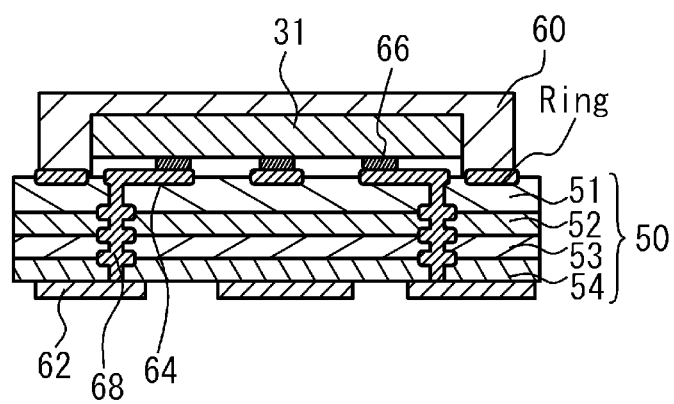

FIGS. 16A through 16C are views of the duplex according to the seventh embodiment. FIGS. 17A and 17B are sectional views taken along lines A-A and B-B illustrated in FIG. 16C, respectively. FIG. 16A is a perspective view of a substrate, FIG. 16B is a perspective view of piezoelectric substrates on the substrate, and FIG. 16C is a perspective view of a sealed device including the piezoelectric substrates in FIG. 16B. As illustrated in FIGS. 16A, 17A and 17B, a substrate 50 is a stacked multilayer substrate composed of layers 51 through 54. Interconnection lines 64 made of a metal such as gold or copper are formed on the top of the substrate 50. Further, via interconnections 68 are formed so as to pass through the stacked layers 51 through 54. The via interconnections 68 have vias that are penetrated through the layers 51 through 54 and are full of metal. A seal ring is formed on the upper surface of the substrate 50 along the periphery of the substrate 50. Foot pads 62 are formed on the bottom surface of the substrate 50.

As illustrated in FIGS. 16B, 17A and 17B, the piezoelectric substrate 31 on which the filer part 10 is formed and the piezoelectric substrate 32 on which the reception filter 14 is formed are flip-chip mounted on the upper surface of the substrate 50 by using metal such as gold or solder.

The piezoelectric substrates 31 and 32 are sealed with a seal member 60, as illustrated in FIGS. 16C, 17A and 17B. The seal member 60 may be formed of a metal such as solder. The seal ring has a good wettability because of the use of metal. Thus, the seal member 60 formed of solder or the like is formed on the seal ring. The seal member 60 may be formed of an insulative substance such as resin.

Figure 18A:
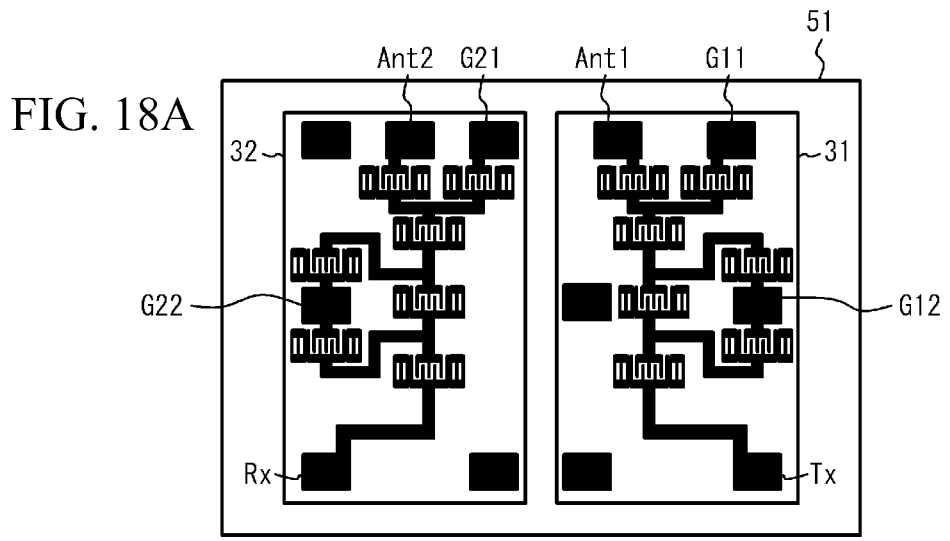
FIGS. 18A through 18C are plan views of the upper surface of each layer.

FIGS. 18A through 19C are plan views of the upper or lower surface of each layer. FIG. 18A is a view seen through the piezoelectric substrates 31 and 32 mounted on the layer 51. The internal structures of the piezoelectric substrates 31 and 32 have the same arrangements as illustrated in FIGS. 12B and 13B, and a description thereof is omitted here.

Figure 18B:
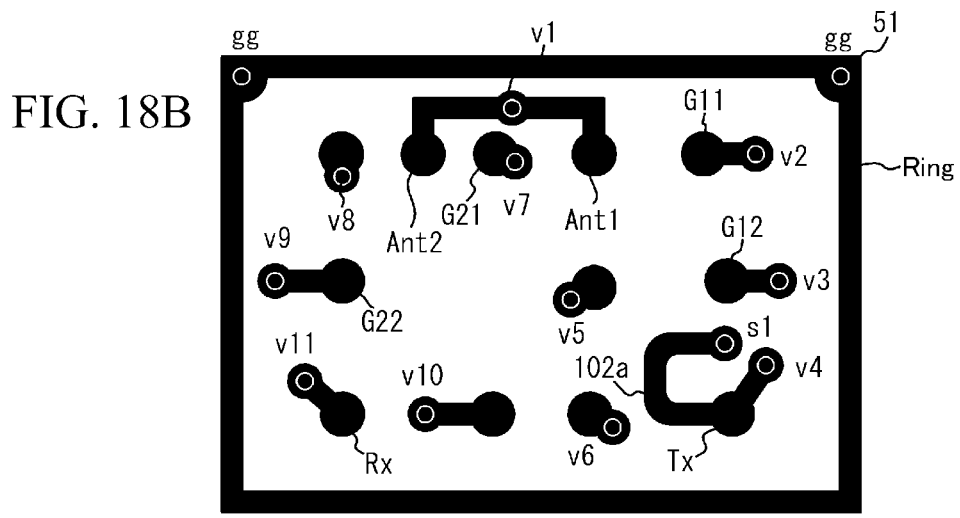

FIG. 18B is a plan view of the layer 51. The pads Ant1, G11, G12 and Tx formed on the piezoelectric substrate 31 are electrically connected to the pads Ant1, G11, G12 and Tx formed on the layer 51 by bumps, respectively. The pads Ant2, G21, G22 and Rx formed on the piezoelectric substrate 32 are electrically connected to the pads Ant2, G21, G22 and Rx formed on the layer 51 by bumps, respectively. Symbols v1~v11, gg and s1 indicate the via interconnections 68 that pass through the layer 51. An interconnection line 102a out of the interconnection lines 64 formed on the layer 51 is part of the inductor L1 connected to the transmission terminal Tx. The seal ring is grounded via the via interconnection gg.

Figure 18C:
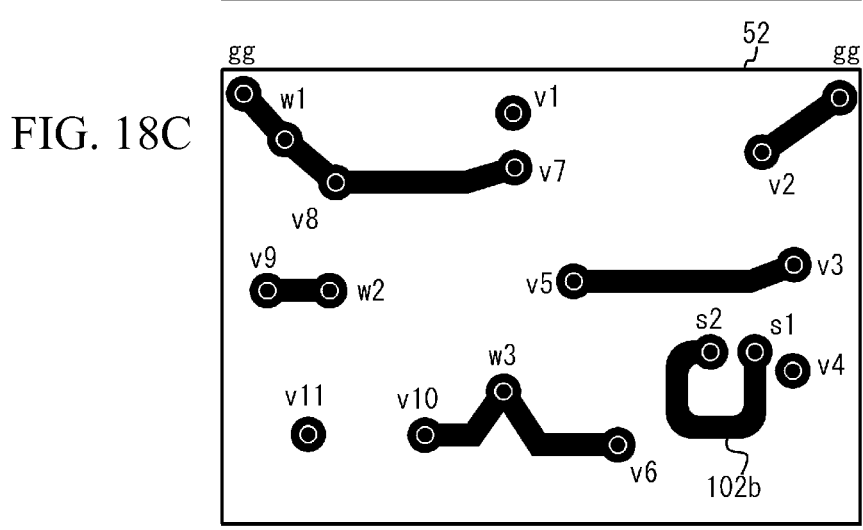
Figure 20A:
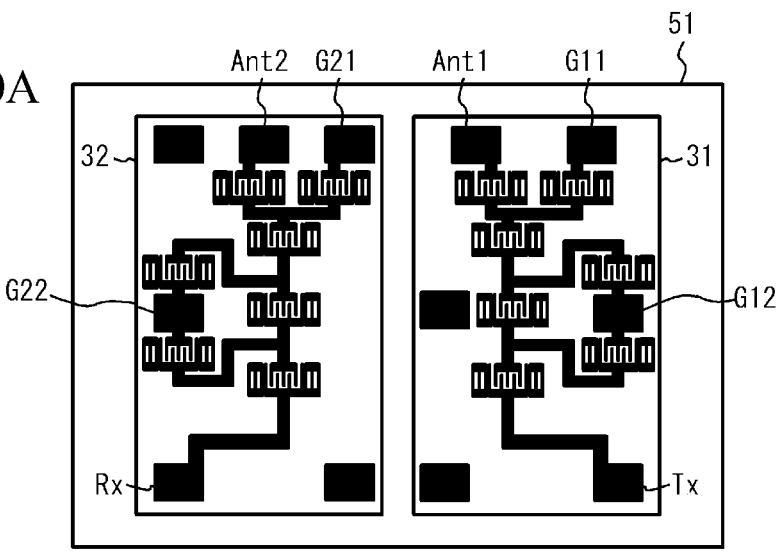
FIGS. 20A through 20C are plan views of the upper surface of each layer of a substrate on which a filter is mounted according to an eighth embodiment.
Figure 20B:
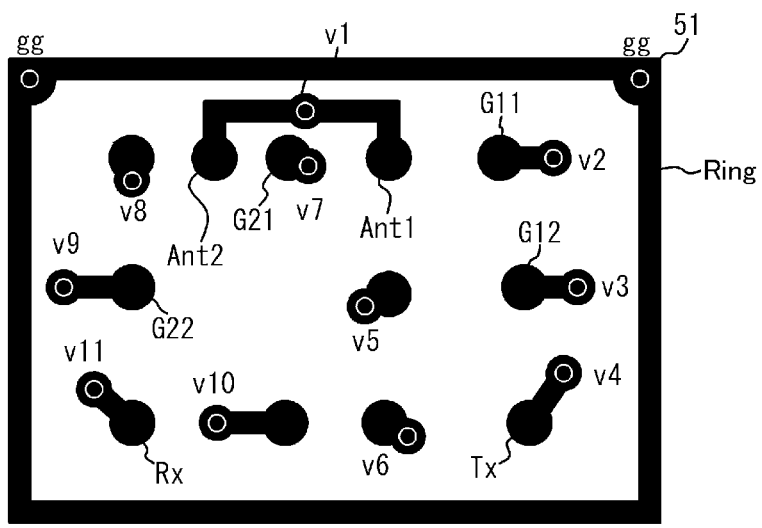
Figure 20C:
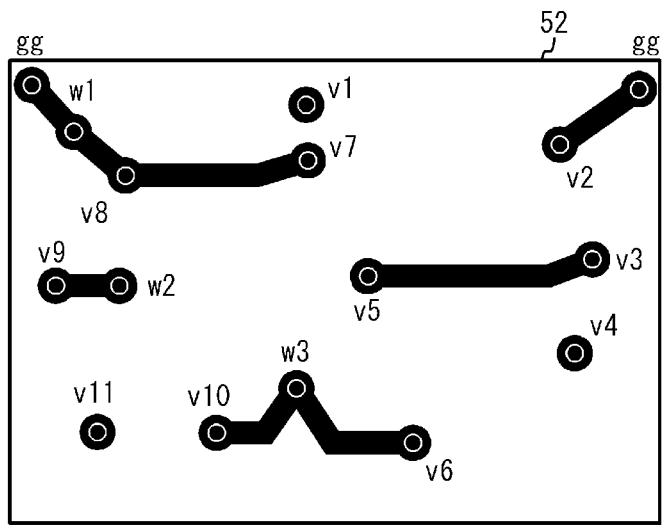
Figure 21A:
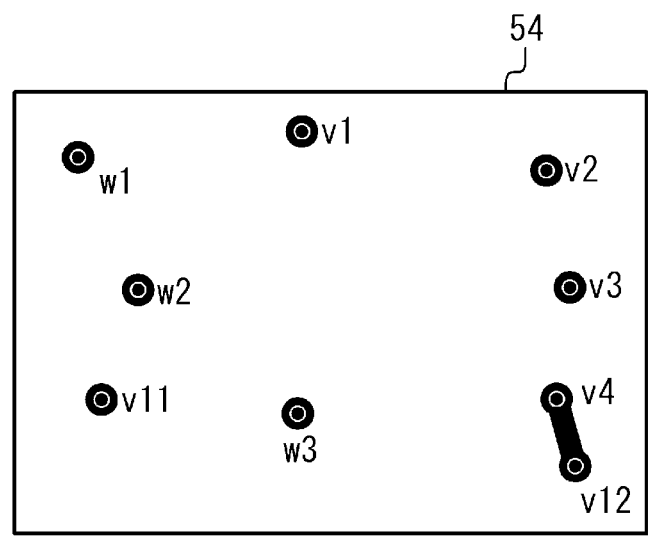
FIGS. 21A and 21B are plan views of the upper or lower surface of each layer of the substrate on which the filter is mounted according to the eighth embodiment.
Figure 21B:
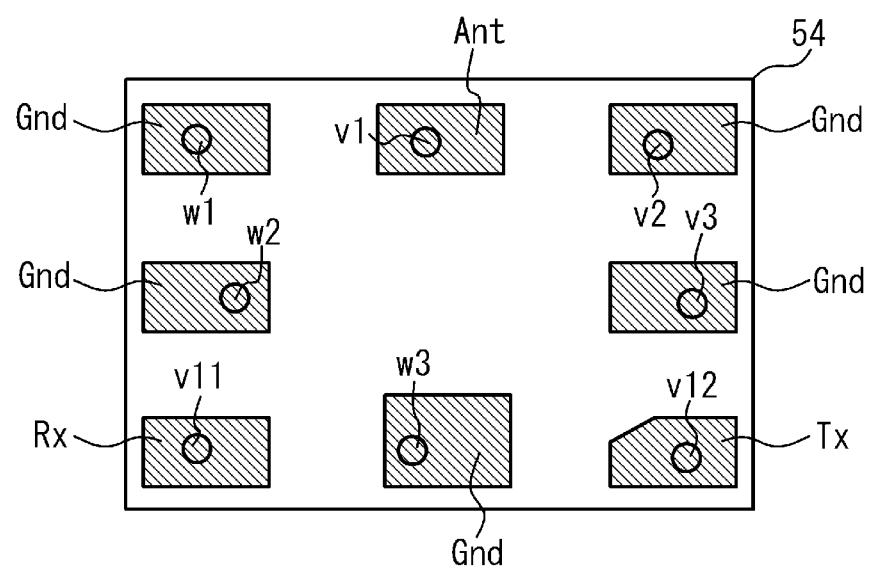

FIG. 18C is a plan view of the layer 52. Referring to FIG. 18C, via interconnections v1~v11, s1, s2, and w1~w3 are formed in the layer 52. An interconnection line 102b out of the interconnection lines 64 formed on the upper surface of the layer 52 is part of the inductor L1 connected to the interconnection line 102a via the via interconnection s1.

FIG. 19A is a plan view of the layer 53. Referring to FIG. 19A, the vias v1~v4, v11, v12, s2, s3 and w1~w3 are formed in the layer 53. An interconnection line 104a out of the interconnection lines 64 formed on the upper surfaces of the layer 53 is part of the distributed-constant line D1 connected to the inductor via the via interconnection s2.

FIG. 19B is a plan view of the layer 54. Referring to FIG. 19B, the via interconnections v1~v3, v11, v12 and w1~w3 are formed in the layer 54. An interconnection line 104b formed on the upper surface of the layer 54 is part of the distributed-constant line D1 connected to the interconnection line 104a via the via interconnection s3.

FIG. 19C is a plan view of the lower surface of the layer 54 seen through the layer 54 from the top thereof. The foot pads 62 are formed on the lower surface of the layer 54. The foot pad Ant corresponds to the common terminal Tant illustrated in FIG. 11. The foot pad Tx corresponds to the first terminal T1 illustrated in FIG. 11. The foot pad Rx corresponds to the second terminal T2 illustrated in FIG. 11. The foot pad Gnd is grounded. The interconnection line 104b formed on the upper surface of the layer 54 is depicted by a broken line. An area 106 in which the foot pad Ant and the interconnection line 104b overlap each other functions as the MIM capacitor C1.

The seventh embodiment is configured to have the inductor L1 formed by the interconnection lines 102a and 102b, the distributed-constant line D1 formed by the interconnection lines 104a and 104b, an the capacitor C1 formed by the interconnection line 104b and the foot pad Ant, which components are connected in series between the transmission terminal Tx and the common terminal Ant, and are connected in parallel with the filter part 10.

The path 12 may be formed in the substrate 50 on which the filter part 10 and the second filter 14 are mounted.

Eighth Embodiment

An eighth embodiment has an exemplary structure in which the inductor is mounted outside of the substrate on which the filter is mounted. FIGS. 20A through 21B are views of the upper and lower surfaces of layers of a substrate on which the filter is mounted according to the eighth embodiment. FIGS. 20A through 21B correspond to FIGS. 18A through 18C, and FIGS. 19B and 19C that illustrate the seventh embodiment, respectively. As compared with the seventh embodiment, the substrate 50 includes the layers 51, 52 and 54 and does not include the layer 53. The eight embodiment is configured not to have, within the substrate 50, the interconnection lines 102a, 102b, 104a and 104b and the MIM capacitor C1. The other structures of the eighth embodiment are the same as those of the seventh embodiment illustrated in FIGS. 18A through 18C, and FIGS. 19B and 19C, and a description thereof is omitted here.

Figure 22A:
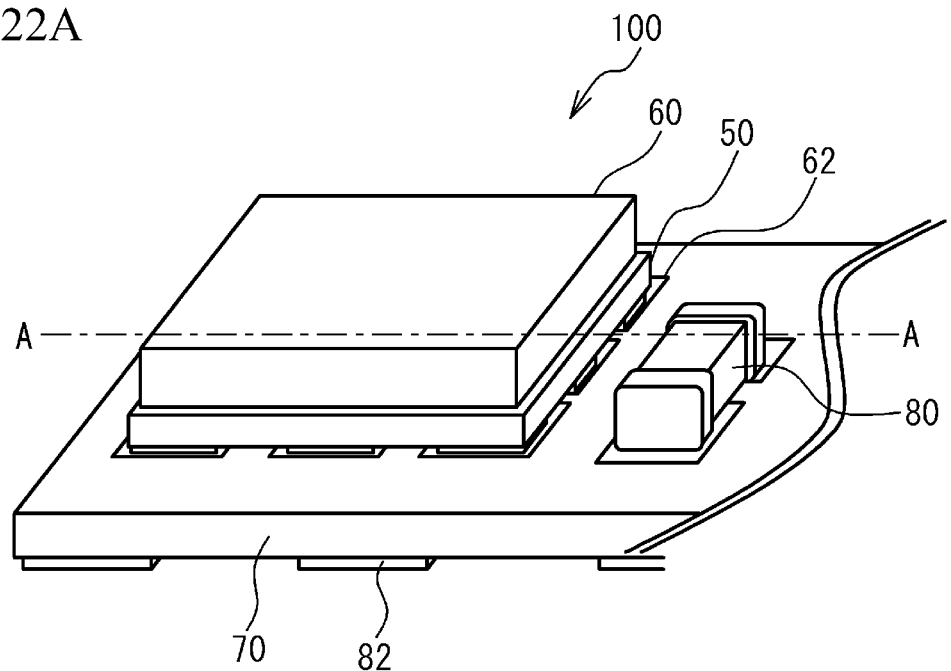
FIGS. 22A and 22B illustrate a duplexer mounted on a substrate according to the eighth embodiment.
Figure 22B:
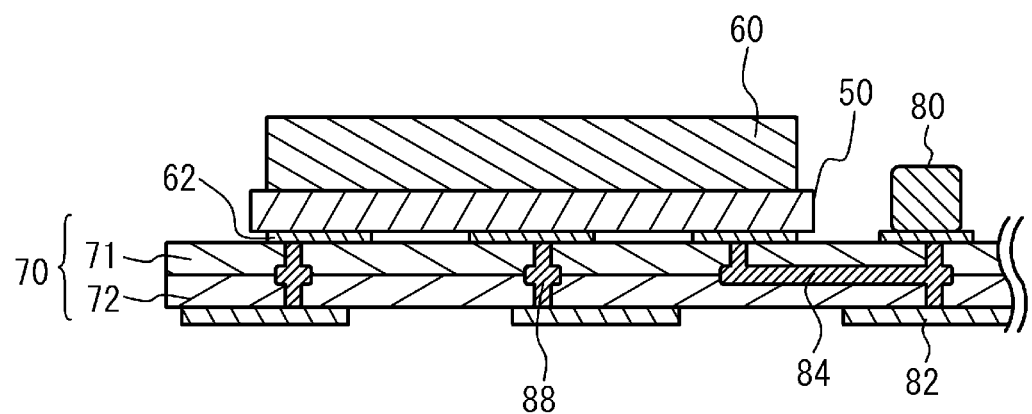

FIGS. 22A and 22B illustrate a duplexer 100 mounted on a substrate 70 according to the eighth embodiment. The substrate 70 may be a stacked multilayer substrate having layers 71 and 72. The layers 71 and 72 are made of an insulator such as ceramic or resin. Interconnection lines 84 made of a metal are formed on the layers 71 and 72. Via interconnections 88 pass through the layers 71 and 72. Foot pads 82 are formed on the lower surface of the substrate 70. The substrate 50 on which the filter is mounted is mounted on the substrate 70. A chip inductor 80 is mounted on the substrate 70.

Figure 23A:
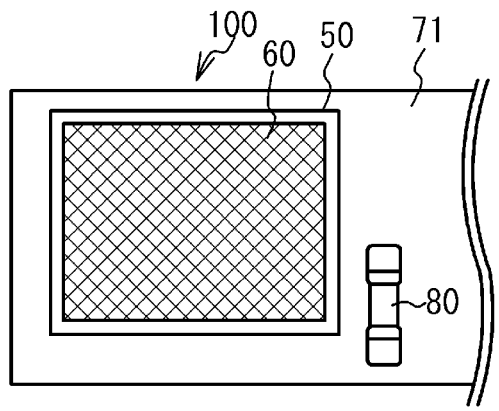
FIGS. 23A through 23D are plan views of the upper or lower surface of each layer.
Figure 23B:
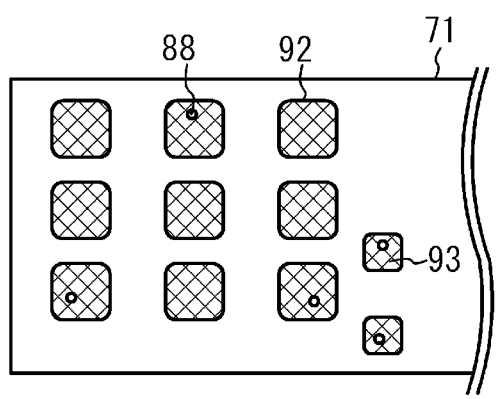

FIGS. 23A through 23D are views of the upper or lower surface of each layer employed in the eighth embodiment. FIG. 23A is a plan view of the layer 71 on which the substrate 50 and the inductor 80 are mounted. FIG. 23B is a plan view of the layer 71 on which pads 92 and 93 made of a metal are formed. The pads 92 are electrically connected to the food pads 62 on the substrate 50 by using a brazing filler metal such as solder. The pads 93 are electrically connected to the both ends of the chip inductor 80 by using a brazing filler metal such as solder. The via interconnections 88 made of a metal pierces the layer 71.

Figure 23C:
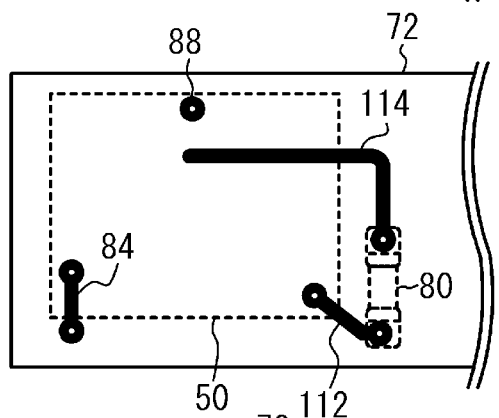

FIG. 23C is a plan view of the layer 72. The interconnection lines 84 are formed on the upper surface of the layer 72. An interconnection line 112 out of the interconnection lines 84 is used to interconnect the foot pad Tx (depicted by a broken line) on the substrate 50 and the chip inductor 80 (depicted by another broken line). An interconnection line 114 is the distributed-constant line D1 connected to the inductor 80.

Figure 23D:
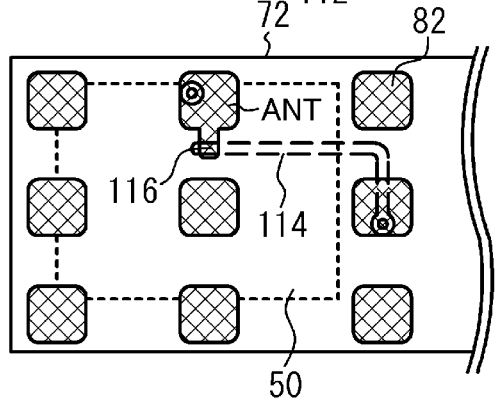

FIG. 23D is a view of the lower surface of the layer 72 seen through the layer 72 from the top thereof. The interconnection line 112 is illustrated by a broken line. The foot pads 82 made of a metal are formed on the lower surface of the layer 72. An area 116 in which the foot pad ANT connected to the foot pad Ant on the substrate 50 and the interconnection line 114 overlap each other functions as the MIM capacitor C1.

As described above, the eight embodiment is configured to have the inductor L1 formed by the chip inductor 80 (an RF element), the distributed-constant line D1 formed by the interconnection line 114 and the capacitor C1 formed by the interconnection line 114 and the foot pad ANT, which elements are connected in series between the transmission terminal Tx and the common terminal Ant are connected in parallel with the filter part 10.

In the eighth embodiment, the path 12 may be formed within the substrate 70 on which the substrate 50 is mounted. The inductor L1, the capacitor C1 and the distributed-constant line D1 may be formed by means other than the seventh and eighth embodiments.

Ninth Embodiment

Figure 24A:
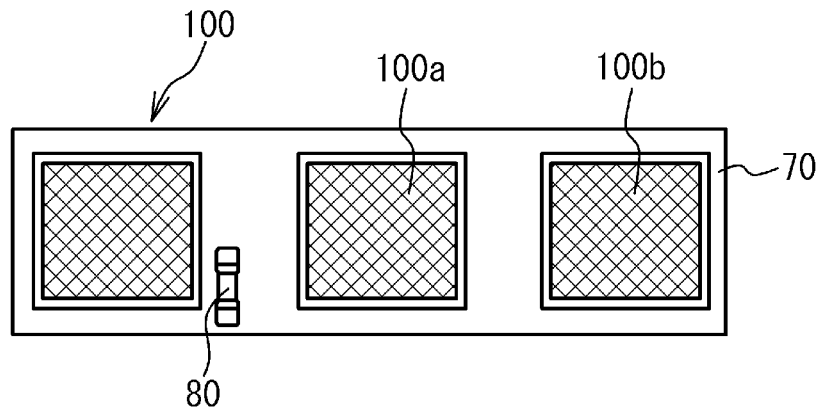
FIGS. 24A through 24C are plan views of RF modules according to a ninth embodiment.
Figure 24B:
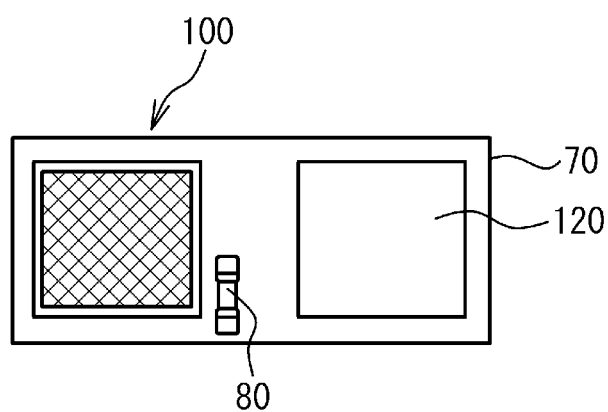
Figure 24C:
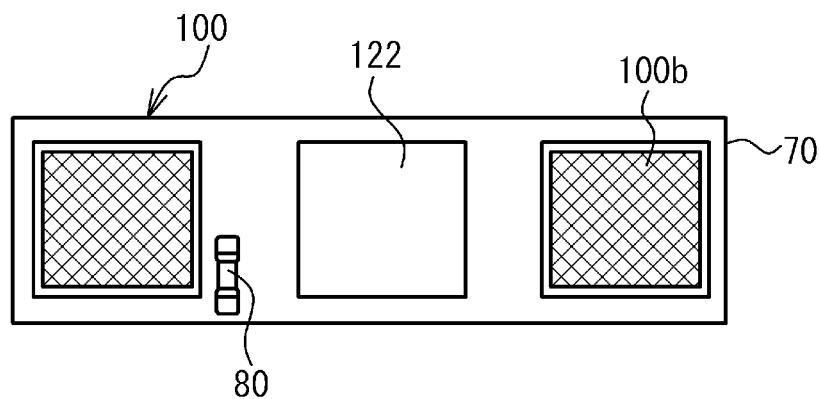

A ninth embodiment includes exemplary RF modules, each of which includes the duplexer of the eighth embodiment. FIGS. 24A through 24C are plan views of the RF module of the ninth embodiment. As illustrated in FIG. 24A, duplexers 100a and 100b are mounted on the substrate 70 used in the duplexer 100 of the eighth embodiment. As illustrated in FIG. 24B, a power amplifier 120 (an RF element) is mounted on the substrate 70 used in the duplexer 100 of the eighth embodiment. As illustrated in FIG. 24C, the duplexer 100b and a switch 122 (an RF element) are mounted on the substrate 70 used in the duplexer 100 of the eighth embodiment.

As described above, the RF modules may be configured to mount components other than the duplexer 100 on the substrate 70.

The RF modules are not limited to the cellular phones but wireless devices such as wireless LAN (Local Area Network).

The present invention is not limited to the specifically described embodiments but includes other embodiments and variations within the scope of the claimed invention.

What is claimed is:

1. A filter circuit comprising:
a filter part connected between an input terminal and an output terminal and configured to have a passband; and
a path connected in parallel with the filter part between the input terminal and the output terminal,
the path having an impedance that enables a first signal passing through the path from the input terminal to the output terminal and a second signal passing through the filter part from the input terminal to the output terminal to have an opposite phase relationship in a frequency band outside of the passband and have almost equal amplitudes in the frequency band,
wherein the path has an impedance that changes from a capacitive impedance to an inductive impedance at frequencies lower than the passband and that is an inductive impedance at frequencies higher than the passband.

2. The filter circuit according to claim 1, wherein the frequency band is located at frequencies lower than the passband and is located at frequencies higher than the passband.

3. The filter circuit according to claim 1, wherein the path includes a lumped-constant inductor connected in series between the input terminal and the output terminal.

4. A filter circuit comprising:
a filter part connected between an input terminal and an output terminal and configured to have a passband; and
a path connected in parallel with the filter part between the input terminal and the output terminal,
the path having an impedance that enables a first signal passing through the path from the input terminal to the output terminal and a second signal passing through the filter part from the input terminal to the output terminal to have an opposite phase relationship in a frequency band outside of the passband and have almost equal amplitudes in the frequency band,
wherein the path includes a lumped-constant inductor connected in series between the input terminal and the output terminal and a lumped-constant capacitor connected in series to the lumped-constant inductor between the input terminal and the output terminal.

5. The filter circuit according to claim 3, wherein the path includes a distributed-constant line connected in series to the inductor between the input terminal and the output terminal.

6. The filter circuit according to claim 4, wherein the path includes a distributed-constant line connected in series between the inductor and the capacitor.

7. A duplexer comprising:
a first filter connected between a common terminal and a first terminal; and
a second filter connected between the common terminal and a second terminal,
at least one of the first and second filters including:
a filter part connected between the common terminal and one of the first and second terminals and configured to have a passband; and
a path connected in parallel with the filter part between the common terminal and the one of the first and second terminals,
the path having an impedance that enables a first signal passing through the path between the common terminal and the one of the first and second terminals and a second signal passing through the filter part between the common terminal and the one of the first and second terminals to have an opposite phase relationship in a frequency band outside of the passband and have almost equal amplitudes in the frequency band,
wherein the path has an impedance that changes from a capacitive impedance to an inductive impedance at frequencies lower than the passband and that is an inductive impedance at frequencies higher than the passband.

8. An RF module including:
an RF element; and
a duplexer connected to the RF element,
the duplexer including:
a first filter connected between a common terminal and a first terminal; and
a second filter connected between the common terminal and a second terminal,
at least one of the first and second filters including:
a filter part connected between the common terminal and one of the first and second terminals and configured to have a passband; and
a path connected in parallel with the filter part between the common terminal and the one of the first and second terminals,
the path having an impedance that enables a first signal passing through the path between the common terminal and the one of the first and second terminals and a second signal passing through the filter part between the common terminal and the one of the first and second terminals to have an opposite phase relationship in a frequency band outside of the passband and have almost equal amplitudes in the frequency band,
wherein the path has an impedance that changes from a capacitive impedance to an inductive impedance at frequencies lower than the passband and that is an inductive impedance at frequencies higher than the passband.

9. A duplexer comprising:
a first filter connected between a common terminal and a first terminal; and
a second filter connected between the common terminal and a second terminal,
at least one of the first and second filters including:
a filter part connected between the common terminal and one of the first and second terminals and configured to have a passband; and
a path connected in parallel with the filter part between the common terminal and the one of the first and second terminals,
the path having an impedance that enables a first signal passing through the path between the common terminal and the one of the first and second terminals and a second signal passing through the filter part between the common terminal and the one of the first and second terminals to have an opposite phase relationship in a frequency band outside of the passband and have almost equal amplitudes in the frequency band,
wherein the path includes a lumped-constant inductor connected in series between the common terminal and the one of the first and second terminals and a lumped-constant capacitor connected in series to the lumped-constant inductor between the common terminal and the one of the first and second terminals.

10. An RF module including:
an RF element; and
a duplexer connected to the RF element,
the duplexer including:
a first filter connected between a common terminal and a first terminal; and
a second filter connected between the common terminal and a second terminal, at least one of the first and second filters including:
a filter part connected between the common terminal and one of the first and second terminals and configured to have a passband; and
a path connected in parallel with the filter part between the common terminal and the one of the first and second terminals,
the path having an impedance that enables a first signal passing through the path between the common terminal and the one of the first and second terminals and a second signal passing through the filter part between the common terminal and the one of the first and second terminals to have an opposite phase relationship in a frequency band outside of the passband and have almost equal amplitudes in the frequency band,
wherein the path includes a lumped-constant inductor connected in series between the common terminal and the one of the first and second terminals and a lumped-constant capacitor connected in series to the lumped-constant inductor between the common terminal and the one of the first and second terminals.

\* \* \* \* \*